US007364952B2

(12) United States Patent
Im

(10) Patent No.: US 7,364,952 B2
(45) Date of Patent: Apr. 29, 2008

(54) SYSTEMS AND METHODS FOR PROCESSING THIN FILMS

(75) Inventor: James Im, New York, NY (US)

(73) Assignee: The Trustees of Columbia University in the City of New York, New York, NY (US)

(*) Notice: Subject to any disclaimer, the term of this patent is extended or adjusted under 35 U.S.C. 154(b) by 266 days.

(21) Appl. No.: 10/754,133

(22) Filed: Jan. 9, 2004

(65) Prior Publication Data
US 2005/0059265 A1    Mar. 17, 2005

Related U.S. Application Data

(60) Provisional application No. 60/503,346, filed on Sep. 16, 2003.

(51) Int. Cl.
*H01L 21/00* (2006.01)
*H01L 21/84* (2006.01)

(52) U.S. Cl. .................. 438/150; 438/795; 219/121.6; 219/121.76

(58) Field of Classification Search ................. 438/149, 438/150, 795, 799; 117/7, 10; 219/121.6, 219/121.76
See application file for complete search history.

(56) References Cited

U.S. PATENT DOCUMENTS 3,632,205 A    1/1972    Marcy (Continued)

FOREIGN PATENT DOCUMENTS

DE    19839 718    9/1998

(Continued)

OTHER PUBLICATIONS

Boyd, I. W., "Laser Processing of Thin Films and Microstructures, Oxidation, Deposition and Etching of Insulators," (Springer—Verlag Berlin Heidelber, 1987.

(Continued)

*Primary Examiner*—Mary Wilczewski
*Assistant Examiner*—Thanh Y. Tran
(74) *Attorney, Agent, or Firm*—Wilmer Cutler Pickering Hale and Dorr LLP

(57) ABSTRACT

The present disclosure is directed to methods and systems for processing a thin film samples. In an exemplary method, semiconductor thin films are loaded onto two different loading fixtures, laser beam pulses generated by a laser source system are split into first laser beam pulses and second laser beam pulses, the thin film loaded on one loading fixture is irradiated with the first laser beam pulses to induce crystallization while the thin film loaded on the other loading fixture is irradiated with the second laser beam pulses. In a preferred embodiment, at least a portion of the thin film that is loaded on the first loading fixture is irradiated while at least a portion of the thin film that is loaded on the second loading fixture is also being irradiated. In an exemplary embodiment, the laser source system includes first and second laser sources and an integrator that combines the laser beam pulses generated by the first and second laser sources to form combined laser beam pulses. In certain exemplary embodiments, the methods and system further utilize additional loading fixtures for processing additional thin film samples. In such methods and systems, the irradiation of thin film samples loaded on some of the loading fixtures can be performed while thin film samples are being loaded onto the remaining loading fixtures. In certain exemplary methods and systems, the crystallization processing of the semiconductor thin film samples can consist of a sequential lateral solidification (SLS) process.

18 Claims, 13 Drawing Sheets

U.S. PATENT DOCUMENTS

| | | |
|---|---|---|
| 4,234,358 A | 11/1980 | Celler et al. |
| 4,309,225 A | 1/1982 | Fan et al. |
| 4,382,658 A | 5/1983 | Shields et al. |
| 4,456,371 A | 6/1984 | Lin |
| 4,639,277 A | 1/1987 | Hawkins |
| 4,691,983 A | 9/1987 | Kobayashi et al. |
| 4,727,047 A | 2/1988 | Bozler et al. |
| 4,758,533 A | 7/1988 | Magee et al. |
| 4,793,694 A | 12/1988 | Liu |
| 4,800,179 A | 1/1989 | Mukai |
| 4,855,014 A | 8/1989 | Kakimoto et al. |
| 4,870,031 A | 9/1989 | Sugahara et al. |
| 4,940,505 A | 7/1990 | Schachameyer et al. |
| 4,970,546 A | 11/1990 | Suzuki et al. |
| 4,977,104 A | 12/1990 | Sawada et al. |
| 5,032,233 A | 7/1991 | Yu et al. |
| 5,061,655 A | 10/1991 | Ipposhi et al. |
| RE33,836 E | 3/1992 | Resor, III et al. |
| 5,145,808 A | 9/1992 | Sameshima et al. |
| 5,204,659 A | 4/1993 | Sarma |
| 5,233,207 A | 8/1993 | Anzai |
| 5,285,236 A | 2/1994 | Jain |
| 5,291,240 A | 3/1994 | Jain |
| 5,304,357 A | 4/1994 | Sato et al. |
| 5,373,803 A | 12/1994 | Noguchi et al. |
| 5,395,481 A | 3/1995 | McCarthy |
| 5,409,867 A | 4/1995 | Asano |
| 5,453,594 A | 9/1995 | Konecny |
| 5,456,763 A | 10/1995 | Kaschmitter et al. |
| 5,496,768 A | 3/1996 | Kudo |
| 5,512,494 A | 4/1996 | Tanabe |
| 5,523,193 A | 6/1996 | Nelson |
| 5,529,951 A | 6/1996 | Noguchi et al. |
| 5,591,668 A | 1/1997 | Maegawa et al. |
| 5,710,050 A | 1/1998 | Makita et al. |
| 5,721,606 A | 2/1998 | Jain |
| 5,742,426 A | 4/1998 | York |
| 5,756,364 A | 5/1998 | Tanaka et al. |
| 5,766,989 A | 6/1998 | Maegawa et al. |
| 5,844,588 A | 12/1998 | Anderson |
| 5,861,991 A | 1/1999 | Fork |
| 5,893,990 A | 4/1999 | Tanaka |
| 5,986,807 A | 11/1999 | Fork |
| 6,014,944 A | 1/2000 | Aklufi et al. |
| 6,072,631 A | 6/2000 | Guenther et al. |
| 6,081,381 A | 6/2000 | Shalapenok et al. |
| 6,117,752 A | 9/2000 | Suzuki |
| 6,120,976 A | 9/2000 | Treadwell et al. |
| 6,130,009 A | 10/2000 | Smith et al. |
| 6,130,455 A | 10/2000 | Yoshinouchi |
| 6,156,997 A | 12/2000 | Yamazaki et al. |
| 6,162,711 A | 12/2000 | Ma et al. |
| 6,169,014 B1 | 1/2001 | McCulloch |
| 6,172,820 B1 | 1/2001 | Kuwahara |
| 6,177,301 B1 | 1/2001 | Jung |
| 6,187,088 B1 | 2/2001 | Okumura |
| 6,190,985 B1 | 2/2001 | Buynoski |
| 6,193,796 B1 | 2/2001 | Yang |
| 6,203,952 B1 | 3/2001 | O'Brien et al. |
| 6,235,614 B1 | 5/2001 | Yang |
| 6,242,291 B1 | 6/2001 | Kusumoto et al. |
| 6,285,001 B1 | 9/2001 | Fleming et al. |
| 6,300,175 B1 | 10/2001 | Moon |
| 6,313,435 B1 | 11/2001 | Shoemaker et al. |
| 6,316,338 B1 | 11/2001 | Jung |
| 6,320,227 B1 | 11/2001 | Lee et al. |
| 6,322,625 B2 | 11/2001 | Im |
| 6,326,186 B1 | 12/2001 | Kirk et al. |
| 6,326,286 B1 | 12/2001 | Park et al. |
| 6,333,232 B1 | 12/2001 | Kunikiyo |
| 6,341,042 B1 | 1/2002 | Matsunaka et al. |
| 6,348,990 B1 | 2/2002 | Igasaki et al. |
| 6,353,218 B1 | 3/2002 | Yamazaki et al. |
| 6,358,784 B1 | 3/2002 | Zhang et al. |
| 6,368,945 B1 | 4/2002 | Im |
| 6,388,146 B1 | 5/2002 | Onishi et al. |
| 6,388,386 B1 | 5/2002 | Kunii et al. |
| 6,392,810 B1 | 5/2002 | Tanaka |
| 6,393,042 B1 | 5/2002 | Tanaka |
| 6,407,012 B1 | 6/2002 | Miyasaka et al. |
| 6,410,373 B1 | 6/2002 | Chang et al. |
| 6,429,100 B2 | 8/2002 | Yoneda |
| 6,432,758 B1 | 8/2002 | Cheng et al. |
| 6,444,506 B1 | 9/2002 | Kusumoto et al. |
| 6,445,359 B1 | 9/2002 | Ho |
| 6,448,612 B1 | 9/2002 | Miyazaki et al. |
| 6,451,631 B1 | 9/2002 | Grigoropoulos et al. |
| 6,455,359 B1 | 9/2002 | Yamazaki et al. |
| 6,468,845 B1 | 10/2002 | Nakajima et al. |
| 6,472,684 B1 | 10/2002 | Yamazaki et al. |
| 6,476,447 B1 | 11/2002 | Yamazaki et al. |
| 6,482,722 B2 | 11/2002 | Kunii et al. |
| 6,493,042 B1 | 12/2002 | Bozdagi et al. |
| 6,495,067 B1 | 12/2002 | Ono |
| 6,495,405 B2 | 12/2002 | Voutsas et al. |
| 6,501,095 B2 | 12/2002 | Yamaguchi et al. |
| 6,506,636 B2 | 1/2003 | Yamazaki et al. |
| 6,511,718 B1 | 1/2003 | Paz de Araujo et al. |
| 6,512,634 B2 | 1/2003 | Tanaka |
| 6,516,009 B1 | 2/2003 | Tanaka |
| 6,521,492 B2 | 2/2003 | Miyasaka et al. |
| 6,526,585 B1 | 3/2003 | Hill |
| 6,528,359 B2 | 3/2003 | Kusumoto et al. |
| 6,535,535 B1 | 3/2003 | Yamazaki et al. |
| 6,555,449 B1 | 4/2003 | Im et al. |
| 6,563,077 B2 | 5/2003 | Im |
| 6,573,163 B2 | 6/2003 | Voutsas et al. |
| 6,573,531 B1 | 6/2003 | Im et al. |
| 6,577,380 B1 | 6/2003 | Sposili et al. |
| 6,582,827 B1 | 6/2003 | Im |
| 6,590,228 B2 | 7/2003 | Voutsas et al. |
| 6,608,326 B1 | 8/2003 | Shinagawa et al. |
| 6,621,044 B2 | 9/2003 | Jain et al. |
| 6,635,554 B1 | 10/2003 | Im et al. |
| 6,635,932 B2 | 10/2003 | Grigoropoulos et al. |
| 6,667,198 B2 | 12/2003 | Shimoto et al. |
| 6,693,258 B2 | 2/2004 | Sugano et al. |
| 6,734,635 B2 | 5/2004 | Kunii et al. |
| 6,784,455 B2 | 8/2004 | Maekawa et al. |
| 6,830,993 B1 | 12/2004 | Im et al. |
| 6,858,477 B2 | 2/2005 | Deane et al. |
| 6,908,835 B2 | 6/2005 | Sposili et al. |
| 6,961,117 B2 | 11/2005 | Im |
| 2001/0001745 A1 | 5/2001 | Im et al. |
| 2001/0041426 A1 | 11/2001 | Im |
| 2002/0083557 A1 | 7/2002 | Jung |
| 2002/0104750 A1 | 8/2002 | Ito |
| 2002/0119609 A1* | 8/2002 | Hatano et al. ............... 438/164 |
| 2002/0151115 A1* | 10/2002 | Nakajima et al. ............ 438/149 |
| 2003/0006221 A1* | 1/2003 | Hong et al. ............. 219/121.72 |
| 2003/0013278 A1* | 1/2003 | Jang et al. .................. 438/466 |
| 2003/0029212 A1 | 2/2003 | Im |
| 2003/0068836 A1 | 4/2003 | Hongo et al. |
| 2003/0096489 A1 | 5/2003 | Im et al. |
| 2003/0119286 A1 | 6/2003 | Im et al. |
| 2003/0148565 A1 | 8/2003 | Yamanaka |
| 2004/0053450 A1 | 3/2004 | Sposili et al. |
| 2004/0061843 A1 | 4/2004 | Im |
| 2004/0140470 A1* | 7/2004 | Kawasaki et al. ............. 257/72 |
| 2004/0222187 A1* | 11/2004 | Lin ............................ 216/65 |
| 2005/0032249 A1 | 2/2005 | Im et al. |
| 2005/0034653 A1 | 2/2005 | Im et al. |
| 2005/0059265 A1 | 3/2005 | Im |

2005/0202654 A1  9/2005  Im

FOREIGN PATENT DOCUMENTS

| | | |
|---|---|---|
| DE | 10103 670 | 1/2001 |
| EP | 681316 | 8/1995 |
| EP | 655774 | 7/1996 |
| EP | 1067593 | 10/2001 |
| GB | 2338342 | 12/1999 |
| GB | 2338343 | 12/1999 |
| GB | 2338597 | 12/1999 |
| JP | 62181419 | 8/1987 |
| JP | 2283036 | 11/1990 |
| JP | 04033327 | 2/1992 |
| JP | 04-279064 | 10/1992 |
| JP | 6252048 | 9/1994 |
| JP | 6283422 | 10/1994 |
| JP | 7176757 | 7/1995 |
| JP | 11064883 | 3/1999 |
| JP | 11-281997 | 10/1999 |
| JP | 2001023920 | 1/2001 |
| WO | WO-97/45827 | 12/1997 |
| WO | WO-98/24118 | 6/1998 |
| WO | WO-99/31719 | 6/1999 |
| WO | WO-00/14784 | 3/2000 |
| WO | WO-01/18854 | 3/2000 |
| WO | WO-01/18855 | 3/2001 |
| WO | WO-01/71786 | 9/2001 |
| WO | WO-01/71791 | 9/2001 |
| WO | WO-02/31869 | 4/2002 |
| WO | WO-02/42847 | 5/2002 |
| WO | WO-02/86954 | 5/2002 |
| WO | WO-02/086955 | 10/2002 |
| WO | WO-03/018882 | 3/2003 |
| WO | WO-03/046965 | 6/2003 |
| WO | WO-03/084688 | 10/2003 |
| WO | WO-2004/017379 | 2/2004 |
| WO | WO-2004/017380 | 2/2004 |
| WO | WO-2004/017381 | 2/2004 |
| WO | WO-2004/017382 | 2/2004 |
| WO | WO-2004/075263 | 9/2004 |
| WO | WO-2005/029546 | 3/2005 |
| WO | WO-2005/029548 | 3/2005 |
| WO | WO-2005/029550 | 3/2005 |

OTHER PUBLICATIONS

Broadbent et al., "Excimer Laser Processing of Al-1%Cu/TiW Interconnect Layers," Proceedings, Sixth International IEEE VLSI Multilevel Interconnection Conference, Santa Clara, CA, Jun. 12-13, pp. 336-345 (1989).

Brotherton et al., "Influence of Melt Depth in Laser Crystallized Poly-Si Thin Film Transistors," Journal of Appl. Phys., 82:4086 (1997).

Brotherton, "Polycrystalline Silicon Thin Film Transistors," Semicond. Sci. Tech., 10:721-738 (1995).

Crowder et al., "Low-Temperature Single-Crystal Si TFT's Fabricated on Si Films Processed via Sequential Lateral Solidification," IEEE Electron Device Letter, 19 (8): 306 (1998).

Crowder et al., "Parametric Investigation of SLS-processed Polysilicon Thin Films for TFT Application," Preparations and Characterization, Elsevier, Sequoia, NL, vol. 427, No. 1-2, Mar. 3, 2003, pp. 101-107, XP004417451.

Crowder et al., "Sequential Lateral Solidification of PECVD and Sputter Deposited a-Si Films", Mat. Res. Soc. Symp. Proc. 621:Q. 9.7.1-9.7.6, 2000.

Endert et al., "Excimer Laser: A New Tool for Precision Micromachining," Optical and Quantum Electronics, 27:1319 (1995).

Fogarassy et al., "Pulsed Laser Crystallization of Hydrogen-Free a-Si Thin Films for High-Mobility Poly-Si TFT Fabrication," Applied Physics A—Solids and Surfaces, 56:365-373 (1993).

Geis et al., "Crystallographic orientation of silicon on an amorphous substrate using an artificial surface-relief grating and laser crystallization," Appl. Phys. Lett. 35(1) Jul. 1, 1979, 71-74.

Geis et al., "Silicon graphoepitaxy using a strip-heater oven," Appl. Phys. Lett. 37(5), Sep. 1, 1980, 454-456.

Geis et al., "Zone-Melting recrystallization of SI Films with a moveable-strip heater oven," J. Electro-Chem. Soc., 129: 2812 (1982).

Gupta et al., "Numerical Analysis of Excimer-laser induced melting and solidification of Si Thin Films", Applied Phys. Lett., 71:99, 1997.

Hau-Riege et al., "The Effects Microstructural Transitions at Width Transitions on Interconnect reliability," Journal of Applied Physics, 87(12): 8467-8472.

Im et al., "Controlled Super-Lateral Growth of Si Films for Microstructural Manipulation and Optimization," Phys. Stat. Sol. (a), 166:603 (1998).

Im et al., "Crystalline Si Films for Integrated Active-Matrix Liquid-Crystals Displays," MRS Bulletin, 21:39 (1996).

Im et al., "On the Super Lateral Growth Phenomenon Observed in Excimer Laser-Induced Crystallization of Thin Si Films," Appl. Phys. Lett., 64 (17): 2303 (1994).

Im et al., "Phase Transformation Mechanisms Involved In Excimer Laser Crystallization of Amorphous Silicon Films," Appl. Phys. Lett., 63 (14): 1969 (1993).

Im et al., "Single-Crystal Si Films for Thin-Film Transistor Devices," Appl. Phys. Lett., 70(25): 3434 (1997).

Ishida et al., "Ultra-shallow boxlike profiles fabricated by pulsed ultraviolet-laser doping process," J. Vac. Sci. Technol. B 12(1):399-403, (1994).

Ishihara et al., "A Novel Double-Pulse Excimer-Laser Crystallization Method of Silicon Thin-Films," Publication Office, Japanese Journal of Applied Physics, Tokyo, Japan, 34(8A): 3976-3981 (1995).

Jeon et al., "Two-step laser recrystallization of poly-Si for effective control of grain boundaries," Journal of Non Crystalline Solids, 266-269: 645-649 (2000).

Kahlert, H., "Creating Crystals," OE Magazine, Nov. 2001, 33-35.

Kim et al., "Grain Boundary Location-Controlled Poly-Si Films for TFT Devices Obtained Via Novel Excimer Laser Process," Mat. Res. Soc. Symp. Proc., vol. 358, 1995.

Kim et al., "Multiple Pulse Irradiation Effects in Excimer Laser-Induced Crystallization of Amorphous Si Films," Mat. Res. Soc. Sym. Proc., 321:665-670 (1994).

Kim, "Excimer-Laser-Induced Crystallization of Amorphous Silicon Thin Films," Ph. D. Dissertation Abstract, Columbia University, 1996.

Kim, H. J. et al., "Excimer Laser Induced Crystallization of Thin Amorphous Si Films on SiO2: Implications of Crystallized Microstructures for Phase Transformation Mechanisms," Mat. Res. Soc. Symp. Proc., vol. 283, 1993.

Kim, H.J. et al., "New Excimer-laser-crystallization method for producing large-grained and grain boundary-location-controlled Si Films for Thin Film Transistors", Applied Phys. Lett., 68: 1513.

Leonard, J.P. et al, "Stochastic modeling of solid nucleation in supercooled liquids", Appl. Phys. Lett. 78:22, May 28, 2001, 3454-3456.

Mariucci et al., "Grain boundary location control by patterned metal film in excimer laser crystallized polysilicon," Proceedings of the Fifth International Conference on Polycrystalline Semiconductors, Schwabisch Gmund, Germany, 67-68: 175-180 (1998).

McWilliams et al., "Wafer-Scale Laser Pantography: Fabrication of N-Metal-Oxide-Semiconductor Transistors and Small-Scale Integrated Circuits By Direct-Write Laser-Induced Pyrolytic Reactions," Applied Physics Letters, American Institute of Physics, New York, US, 43(10): 946-948 (1983).

MICRO/LAS Lasersystem GMBH, "Overview of Beam Delivery Systems for Excimer Lasers," (1999).

MICRO/LAS Lasersystem GMBH, "UV Optics Systems for Excimer Laser Based Micromachining and Marking," (1999).

Miyata et al, "Low-Temperature Polycrystalline Silicon Thin-Film Transistors for Large-Area Liquid Crystal Display," Japanese J. of Applied Physics, Part 1—Regular Papers Short Notes & Review Papers, 31:4559-62 (1992).

Nebel, "Laser Interference Structuring of A-Sl:h" Amorphous Silicon Technology—1996, San Francisco, CA Apr. 8-12, Materials Research Society Symposium Proceedings, vol. 420, Pittsburgh, PA (1996).

Noguchi, "Appearance of Single-Crystalline Properties in Fine-Patterned Si Thin Film Transistors (TFTs) by Solid Phase Crystallization (SPC)," Jpn. J. Appl. Phys., 32:L1584-L1587 (1993).

Ozawa et al., "Two-Dimensionally Position-Controlled Excimer-Laser-Crystallization of Silicon Thin Films on Glassy Substrate," Jpn. J. Appl. Phys. 38(10):5700-5705 (1999).

Sato et al., "Mobility anisotropy of electrons in inversion layers on oxidized silicon surfaces," Physical Review B (State) 4, 1950 (1971).

Song et al., "Single Crystal Si Islands on SiO2 Obtained Via Excimer Laser Irradiation of a Patterned Si Film", Applied Phys. Lett., 68:3165, 1996.

Sposili et al., "Line-scan sequential lateral solidification of Si thin films", Appl. Phys. A67, 273-6, 1998.

Sposili et al., "Sequential Lateral Solidification of Thin Silicon Films on SiO2," Appl. Phys. Lett., 69(19): 2864 (1996).

Sposili et al., "Single-Crystal Si Films via a Low-Substrate-Temperature Excimer-Laser Crystallization Method," Mat. Res. Soc. Symp. Proc., 452: 953-958 (1997).

Voutsas, A. T., "Assessment of the Performance of Laser-Based Lateral-Crystallization Technology via Analysis and Modeling of Polysilicon Thin-Film-Transistor Mobility," IEEE Transactions on Electronic Devices, vol. 50, No. 6, Jun. 2003.

Watanabe et al., "Crystallization Process of Polycrystalline Silicon by KrF Excimer Laser Annealing," Japanese J. of Applied Physics, Part 1—Regular Papers Short Notes & Review Papers, 33:4491-98 (1994).

Weiner, K. H. et al. "Laser-assisted, Self-aligned Silicide Formation," A Verdant Technologies technical brief, Aug. 7, 1997, 1-9.

Weiner, K. H. et al., "Ultrashallow Junction Formation Using Projection Gas Immersion Laser Doping (PGILD)," A Verdant Technologies Technical Brief, Aug. 20, 1997.

White et al., "Characterization of thin-oxide MNOS memory transistors," IEEE Trans. Electron Devices ED-19, 1280 (1972).

Yamamuchi et al., "Polycrystalline silicon thin films processed with silicon ion implantation and subsequent solid-phase crystallization: Theory, experiments, and thin-film transistor applications," Journal of Applied Physics, 75(7):3235-3257 (1994).

Yoshimoto et al., "Excimer-Laser-Produced and Two-Dimensionally Position-Controlled Giant Si Grains on Organic SOG Underlayer," p. 285-286, AM-LCD (2000).

Biegelsen, D.K., L.E. Fennell and J.C. Zesch, Origin of oriented crystal growth of radiantly melted silicon on SiO/sub 2, Appl. Phys. Lett. 45, 546 (1984).

Dimitriadis, C.A., J. Stoernenos, P.A. Coxon, S. Friligkos, J. Antonopoulos and N.A. Economou, Effect of pressure on the growth of crystallites of low-pressure chemical-vapor-deposited polycrystalline silicon films and the effective electron mobility under high normal field in thin-film transistors, J. Appl. Phys. 73, 8402 (1993).

Hawkins, W.G. et al., "Origin of lamellae in radiatively melted silicon films," Appl. Phys. Lett. 42(4), Feb. 15, 1983.

Hayzelden, C. and J.L. Batstone, Silicide formation and silicide-mediated crystallization of nickel-implanted amorphous silicon thin films, J. Appl. Phys. 73, 8279 (1993).

Kim, H.-J., et al., "The effects of dopants on surface-energy-driven secondary grain growth in silicon films," J. Appl. Phys. 67 (2), Jan. 15, 1990.

Kimura, M. and K. Egami, Influence of as-deposited film structure on (100) texture in laser-recrystallized silicon on fused quartz, Appl. Phys. Lett. 44, 420 (1984).

Kung, K.T.Y. and R. Reif, Implant-dose dependence of grain size and (110) texture enhancements in polycrystalline Si films by seed selection through ion channeling, J. Appl. Phys. 59, 2422 (1986).

Kung, K.T.Y., R.B. Iverson and R. Reif, Seed selection through ion channeling to modify crystallographic orientations of polycrystalline Si films on SiO/sub 2/:Implant angle dependence, Appl. Phys. Lett. 46, 683 (1985).

Kuriyama, H., T. Nohda, S. Ishida, T. Kuwahara, S. Noguchi, S. Kiyama, S. Tsuda and S. Nakano, Lateral grain growth of poly-Si films with a specific orientation by an excimer laser annealing method, Jpn. J. Appl. Phys. 32, 6190 (1993).

Kuriyama, H., T. Nohda, Y. Aya, T. Kuwahara, K. Wakisaka, S. Kiyama and S. Tsuda, Comprehensive study of lateral grain growth in poly-Si films by excimer laser annealing and its application to thin film transistors, Jpn. J. Appl. Phys. 33, 5657 (1994).

Lee, S.-W. and S.-K. Joo, Low temperature poly-Si thin-film transistor fabrication by metal-induced lateral crystallization, IEEE Electron Device Letters 17, 160 (1996).

Lee, S.-W., Y.-C. Jeon and S.-K. Joo, Pd induced lateral crystallization of amorphous Si thin films, Appl. Phys. Lett. 66, 1671 (1995).

Miyasaka, M., K. Makihira, T. Asano, E. Polychroniadis and J. Stoemenos, In situ observation of nickel metal-induced lateral crystallization of amorphous silicon thin films, Appl. Phys. Lett. 80, 944 (2002).

Nerding, M., S. Christiansen, R. Dassow, K. Taretto, J.R. Kohler and H.P. Strunk, Tailoring texture in laser crystallization of silicon thin-films on glass, Solid State Phenom. 93, 173 (2003).

Ozawa et al., "Two-Dimensionally Position-Controlled Excimer-Laser-Crystallization of Silicon Thin Films on Glassy Substrate," Jpn. J. Appl. Phys. 38(10):5700-5705 (1999).

Thompson, C.V. and H.I. Smith, Surface-energy-driven secondary grain growth in ultrathin (<100 nm) films of silicon, Appl. Phys. Lett. 44, 603 (1984).

Voutsas, A.T. et al.: "Effect of process parameters on the structural characteristics of laterally grown, laser-annealed polycrystalline silicon films," Journal of applicaed Physics, vol. 94, No. 12, Dec. 15, 2003.

* cited by examiner

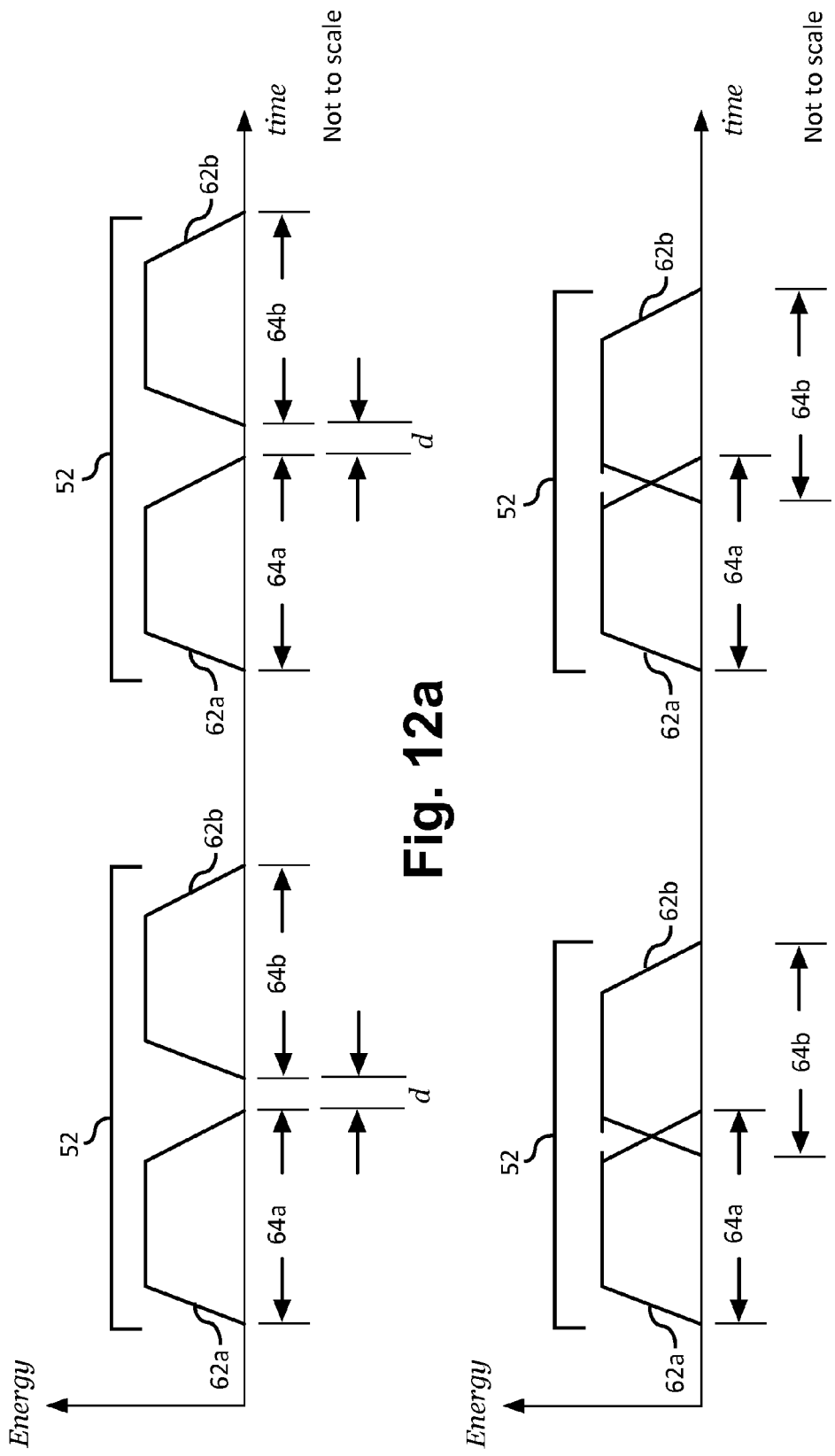

SYSTEMS AND METHODS FOR PROCESSING THIN FILMS

CROSS-REFERENCE TO RELATED APPLICATIONS

This patent application claims priority to U.S. Provisional Patent Application Ser. No. 60/503,346 filed Sep. 16, 2003.

FIELD OF THE INVENTION

This invention relates to a method and system for processing thin films, and more particularly to forming crystalline thin films from amorphous or polycrystalline thin films using laser irradiation. In particular, the present disclosure relates to systems and methods that utilize laser beam pulses to irradiate at least two thin films at the same time.

BACKGROUND OF THE INVENTION

In recent years, various techniques for crystallizing or improving the crystallinity of an amorphous or polycrystalline semiconductor film have been investigated. This technology is used in the manufacture of a variety of devices, such as image sensors and active-matrix liquid-crystal display (AMLCD) devices. In the latter, a regular array of thin-film transistors (TFT) is fabricated on an appropriate transparent substrate such that the TFTs serve as integration regions and pixel regions.

Semiconductor films can be processed using excimer laser annealing (ELA), also known as line beam ELA, in which a region of the film is irradiated by an excimer laser to partially melt the film and then crystallized. The process typically uses a long, narrow beam shape that is continuously advanced over the substrate surface, so that the beam can potentially irradiate the entire semiconductor thin film in a single scan across the surface. ELA produces homogeneous small grained polycrystalline films; however, the method often suffers from microstructural non-uniformities which can be caused by pulse to pulse energy density fluctuations and/or non-uniform beam intensity profiles. In addition, it may take approximately 200 second to 600 seconds to completely process the semiconductor film sample using the ELA techniques, without even taking into consideration the time it takes to load and unload such sample.

Sequential lateral solidification (SLS) using an excimer laser is one method that has been used to form high quality polycrystalline films having large and uniform grains. A large-grained polycrystalline film can exhibit enhanced switching characteristics because the reduced number of grain boundaries in the direction of electron flow provides higher electron mobility. SLS processing also provides controlled grain boundary location. U.S. Pat. Nos. 6,322,625 and 6,368,945 issued to Dr. James Im, and U.S. patent application Ser. Nos. 09/390,535 and 09/390,537, the entire disclosures of which are incorporated herein by reference, and which are assigned to the common assignee of the present application, describe such SLS systems and processes.

In an SLS process, an initially amorphous (or small grain polycrystalline) silicon film is irradiated by a very narrow laser beamlet, e.g., laser beam pulse. The beamlet is formed by passing a laser beam pulse through a slotted mask, which is projected onto the surface of the silicon film. The beamlet melts the amorphous silicon and, upon cooling, the amorphous silicon film recrystallizes to form one or more crystals. The crystals grow primarily inward from edges of the irradiated area toward the center. After an initial beamlet has crystallized a portion of the amorphous silicon, a second beamlet is directed at the silicon film at a location less than the lateral growth length from the previous beamlet. Translating a small amount at a time, followed by irradiating the silicon film, promotes crystal grains to grow laterally from the crystal seeds of the polycrystalline silicon material formed in the previous step. As a result of this lateral growth, the crystals produced tend to attain high quality along the direction of the advancing beamlet. The elongated crystal grains are separated by grain boundaries that run approximately parallel to the long grain axes, which are generally perpendicular to the length of the narrow beamlet. See FIG. 6 for an example of crystals grown according to this method. One of the benefits of these SLS techniques is that the semiconductor film sample and/or sections thereof can be processed (e.g., crystallized) much faster that it would take for the processing the semiconductor film by the conventional ELA techniques. Typically, the processing/crystallization time of the semiconductor film sample depends on the type of the substrates, as well as other factors. For example, it is possible to completely process/crystallize the semiconductor film using the SLS techniques in approximately 50 to 100 seconds not considering the loading and unloading times of such samples.

When polycrystalline material is used to fabricate electronic devices, the total resistance to carrier transport is affected by the combination of barriers that a carrier has to cross as it travels under the influence of a given potential. Due to the additional number of grain boundaries that are crossed when the carrier travels in a direction perpendicular to the long grain axes of the polycrystalline material or when a carrier travels across a larger number of small grains, the carrier will experience higher resistance as compared to the carrier traveling parallel to long grain axes. Therefore, the performance of devices fabricated on polycrystalline films formed using SLS, such as TFTs, will depend upon the crystalline quality and crystalline orientation of the TFT channel relative to the long grain axes, which corresponds to the main growth direction.

In order to uniformly process the semiconductor films, it is important for the beam pulse to be stable. Thus, to achieve the optimal stability, it is preferable to pulse or fire the beam constantly, i.e., without stopping the pulsing of the beam. Such stability may be reduced or compromised when the pulsed beams are turned off or shut down, and then restarted. However, when the semiconductor sample is loaded and/or unloaded from a stage, the pulsed beam would be turned off, and then turned back on when the semiconductor sample to be processed was positioned at the designated location on the stage. The time for loading and unloading is generally referred to as a "transfer time." The transfer time for unloading the processed sample from the stage, and then loading another to-be-processed sample on the stage is generally the same for the ELA techniques and the SLS techniques. Such transfer time can be between 50 and 100 seconds.

In addition, the costs associated with processing semiconductor samples are generally correlated with the number of pulses emitted by the beam source. In this manner, a "price per shot/pulse" is established. If the beam source is not shut down (i.e., still emit the beam pulses) when the next semiconductor sample is loaded unto the stage, or unloaded from the stage, the number of such irradiations by the beam source when the sample is not being irradiated by the beam pulse and corresponding time therefore is also taken into consideration for determining the price per shot. For example, when utilizing the SLS techniques, the time of the irradiation, solidification and crystallization of the semiconductor sample is relatively short as compared to the sample processing time using the ELA techniques. In such case, approximately half of the beam pulses are not directed at the sample since such samples are being either loaded into the stage or unloaded from the stage. Therefore, the beam pulses that are not impinging the samples are wasted.

Accordingly, it is preferable to reduce the price per shot, without stopping the emission of the beam pulses. It is also preferable to be able to process two or more semiconductor samples at the same time, without the need to stop or delay the emission of the laser beam pulses generated by the laser source until the samples are loaded on the respective stages.

SUMMARY OF THE INVENTION

Laser systems are capable of generating laser beam pulses that have sufficient energy and pulse durations to process more than one thin film sample at a time. To efficiently utilize the generated laser beam pulses to process thin film samples, such laser beam pulses can be split into component laser beam pulses. Thin film samples can then be irradiated with the component laser beam pulses. By generating and splitting laser beam pulses that have sufficient energy and pulse durations to process more than one thin film sample at a time, the energy generated by the laser system can be more efficiently utilized in processing the thin film samples. By efficiently utilizing the energy that is produced by the laser system, the manufacturing costs for producing thin films can be reduced, e.g., the price per shot/pulse can be reduced.

The present invention is directed to systems and methods for inducing the melting and subsequent crystallization (upon cooling) of thin films. Generated laser beam pulses can be split into two or more component laser beam pulse that can be used to simultaneously irradiate, via different optical paths, a plurality of thin film samples or, alternatively, can be used simultaneously to irradiate different regions of one thin film sample. An optical path, as that term is used herein, refers to the trajectory of a laser beam pulse as the laser beam pulse travels from a laser beam source to a thin film sample. Optical paths thus extend through both the illumination and projection portions of the exemplary systems. Each optical path has at least one optical element that is capable of manipulating the energy beam characteristics of a laser beam pulse that is directed along that optical path. Thus, by having optical paths that include different optical elements, laser beam pulses having different energy beam characteristics can be directed via the different optical paths to different regions of the thin film sample or, alternatively, to different thin film samples In one aspect of the invention, a method of processing a plurality of thin films includes: loading a first thin film onto a first loading fixture; loading a second thin film onto a second loading fixture; generating laser beam pulses each having a pulse duration; splitting the generated laser beam pulses into at least first laser beam pulses and second laser beam pulses, wherein the first laser beam pulses and the second laser beam pulses each have pulse durations which are substantially equal to the pulse duration of the generated laser beam pulses; directing the first laser beam pulses onto a first optical path and directing the second laser beam pulses onto a second optical path; irradiating the first thin film with the first laser beam pulses to induce the melting and subsequent crystallization of at least a portion of the first thin film; and irradiating the second thin film with the second laser beam pulses to induce the melting and subsequent crystallization of at least a portion of the second thin film.

In certain embodiments, at least a portion of the step of irradiating the first thin film and at least a portion of the step of irradiating the second thin film occur simultaneously.

In accordance with another aspect of the invention, the step of generating the laser beam pulses includes: generating first component laser beam pulses each having a first pulse duration; generating second component laser beam pulses each having a second pulse duration; and combining the first component laser beam pulses with the second component laser beam pulses to form the generated laser beam pulses.

In certain embodiment, the method further includes: loading a third thin film onto a third loading fixture while the first thin film is being irradiated; irradiating the third thin film with the first laser beam pulse to induce the melting and subsequent crystallization of at least a portion of the third thin film upon completing the processing of the first thin film; unloading the first thin film from the first loading fixture; and loading another thin film onto the first loading fixture, wherein the steps of unloading the first thin film from the first loading fixture and loading another thin film onto the first loading fixture substantially occur while the third thin film is being irradiated.

In certain other embodiments, the method further includes: loading a fourth thin film onto a fourth loading fixture while the second thin film is being irradiated; irradiating the fourth thin film with the second laser beam pulses to induce the melting and subsequent crystallization of at least a portion of the fourth thin film upon completing the processing of the second thin film; unloading the second thin film from the second loading fixture; and loading another thin film onto the second loading fixture, wherein the steps of unloading the second thin film from the second loading fixture and loading another thin film onto the second loading fixture substantially occur while the fourth thin film is being irradiated.

In accordance with another aspect of the invention, a method of processing a thin film includes: loading a thin film onto a loading fixture; generating a laser beam pulse having a pulse duration; splitting the generated laser beam pulses into at least a first laser beam pulse and a second laser beam pulse, wherein the first laser beam pulse and the second laser beam pulse have pulse durations which are substantially equal to the pulse duration of the generated laser beam pulse; irradiating a first region of the thin film with the first laser beam pulse to induce the melting and subsequent crystallization of the first region of the thin film; and irradiating a second region of the thin film with the second laser beam pulse to induce the melting and subsequent crystallization of the second region of the thin film, wherein at least portions of the steps of irradiating the first region and irradiating the second region occur simultaneously.

In one aspect of the invention, the methods of processing thin films can be utilized to perform excimer laser anneal (ELA) processing, sequential lateral solidification (SLS) processing or uniform grain structure (UGS) crystallization processing.

In one aspect of the invention, a system for processing a plurality of thin films includes: a laser source system for generating laser beam pulses each having a pulse duration; a first loading fixture for securing a thin film; a second loading fixture for securing a thin film; a beam splitting element for splitting the generated laser beam pulses into at least first laser beam pulses and second laser beam pulses, wherein the first laser beam pulses and second laser beam pulses each have pulse durations which are substantially equal to the pulse duration of the generated laser beam pulses; and wherein a thin film loaded on the first loading fixture can be irradiated with the first laser beam pulses and a thin film loaded on the second loading fixture can be irradiated with the second laser beam pulses.

In accordance with another aspect of the invention, the laser source system includes: a first laser source for generating first component laser beam pulses each having a first pulse duration; a second laser source for generating second component laser beam pulses each having a second pulse duration; and an integrator for combining the first component laser beam pulses with the second component laser beam pulses to form the generated laser beam pulses.

In certain embodiments, the system further includes a third loading fixture for securing a thin film wherein a thin film loaded on the third loading fixture can be irradiated with the first laser beam pulses. A beam steering element can be utilized to direct the first laser beam pulses to the first loading fixture and the third loading fixture.

In certain other embodiments, the system additionally includes a fourth loading fixture for securing a thin film wherein a thin film loaded on the fourth loading fixture can be irradiated with the second laser beam pulses.

In accordance with yet another aspect of the invention, a system for processing a thin film includes: a laser source system for generating a laser beam pulse having a pulse duration; a holding fixture for securing a thin film; a beam splitting element for splitting the generated laser beam pulses into at least first laser beam pulses and second laser beam pulses, wherein the first laser beam pulses and second laser beam pulses have pulse durations which are substantially equal to the pulse duration of the generated laser beam pulses; and wherein a region of a thin film that is loaded on the holding fixture can be irradiated with the first laser beam pulses and a different region of the thin film loaded on the loading fixture can be simultaneously irradiated with the second laser beam pulses.

According to one aspect of the invention, the laser source system consists of at least one continuous wave laser, solid-state laser or excimer laser.

BRIEF DESCRIPTION OF THE DRAWINGS

Various objects, features, and advantages of the present invention can be more fully appreciated with reference to the following detailed description of the invention when considered in connection with the following drawing, in which like reference numerals identify like elements. The following drawings are for the purpose of illustration only and are not intended to be limiting of the invention, the scope of which is set forth in the claims that follow.

FIG. 12A through FIG. 12C depict exemplary laser beam pulses generated by the laser source system of FIG. 11.

DETAILED DESCRIPTION OF THE INVENTION

Figure 1:
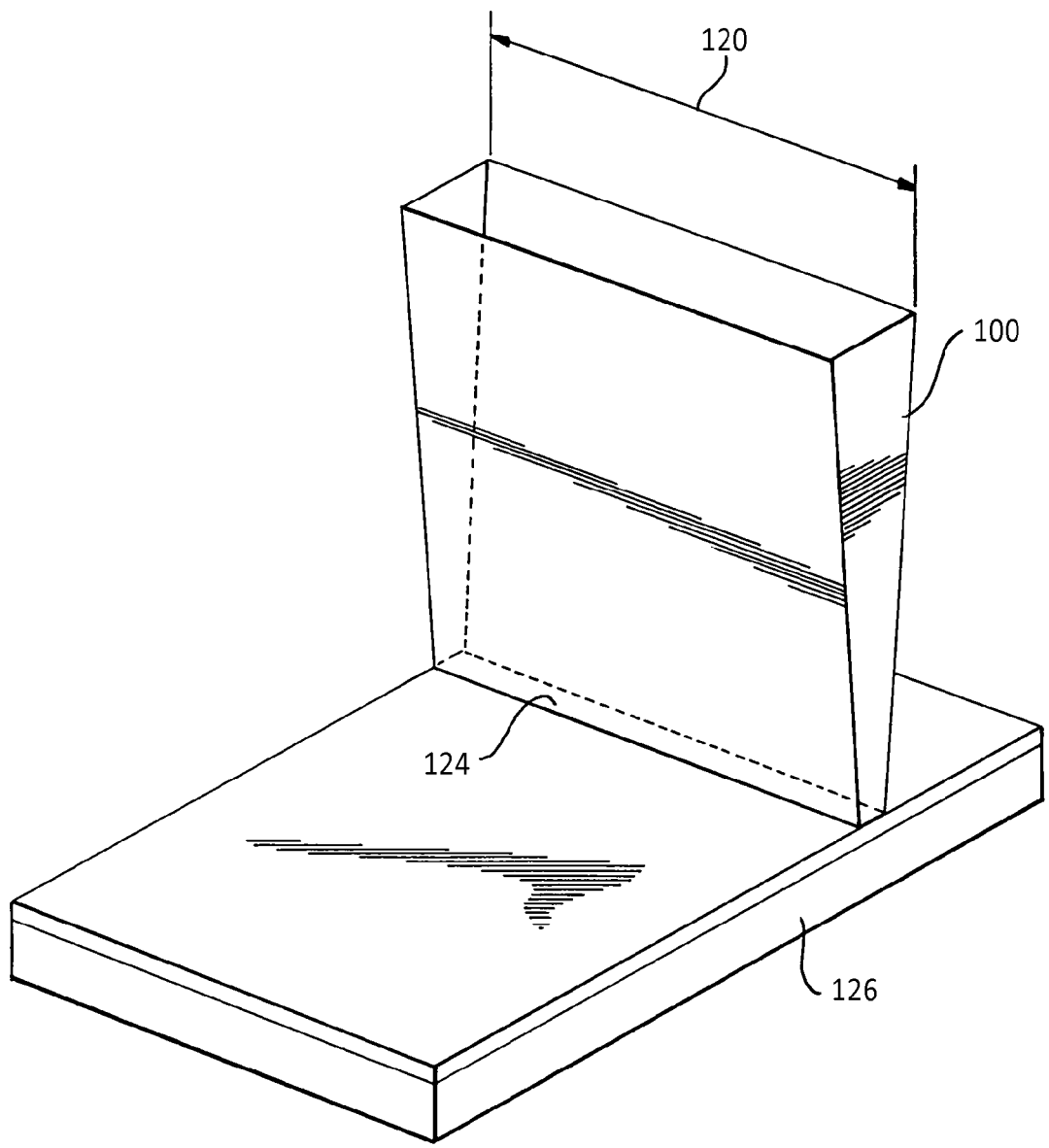
FIG. 1 illustrates the process of excimer laser annealing according to one or more embodiments of the present invention.

The quality of a film that has been crystallized using a laser-induced crystallization growth technique depends, in part, on the energy beam characteristics of the laser beam pulse that is used to irradiate the film and in the manner in which these laser beams are delivered, e.g., continuous scan, two-shot, n-shot, to the film. This observation is used to crystallize different regions of the films with laser beams having different energy beam characteristics in an energy- and time-efficient manner and to provide the film performance characteristics needed in device to be fabricated. Laser-induced crystallization is typically accomplished by laser irradiation using a wavelength of energy that can be absorbed by the film. The laser source may be any conventional laser source, including but not limited to, excimer laser, continuous wave laser and solid-state laser. The irradiation beam pulse can be generated by another known source or short energy pulses suitable for melting a semiconductor can be used. Such known sources can be a pulsed solid state laser, a chopped continuous wave laser, a pulsed electron beam and a pulsed ion beam, etc.

The systems and methods of the present disclosure can be utilized to process a wide variety of types of thin films. In certain embodiments, for example, the described systems and methods can be used to process (e.g., induce and achieve desired crystallization) semiconductor thin films. Such semiconductor thin films can be comprised of silicon, germanium or silicon germanium. Other semiconductor materials, however, may also be used to make up a semiconductor thin film. In certain other embodiments, the described systems and methods may be used to process thin films that are comprised of a metallic material, such as aluminum, copper, nickel, titanium, gold and molybdenum, for example. In certain embodiments, an intermediate layer located beneath the thin film is utilized to protect the substrate from the heat and to prevent impurities from able to diffuse into the thin film. The intermediate layer can be comprised of silicon oxide, silicon nitride and/or mixtures of oxide, nitride or a wide variety of other suitable materials.

Improvements in crystal properties are typically observed regardless of the specific crystallization process employed. The films can be laterally or transversely crystallized, or the films can crystallize using spontaneous nucleation. By "lateral crystal growth" or "lateral crystallization," as those terms are used herein, it is meant a growth technique in which a region of a film is melted to the film/surface interface and in which recrystallization occurs in a crystallization front moving laterally across the substrate surface. By "transverse crystal growth" or "transverse crystallization," as those terms are sued herein, it is meant a growth technique in which a region of film is partially melted, e.g., not through its entire thickness, and in which recrystallization occurs in a crystallization front moving across the film thickness, e.g., in a direction transverse to that of the above-described lateral crystallization. In spontaneous nucleation, crystal growth is statistically distributed over the melted regions and each nucleus grows until it meets other growing crystals. Exemplary crystallization techniques include excimer laser anneal (ELA), sequential lateral solidification (SLS), and uniform grain structure (UGS) crystallization.

Referring to FIG. 1, the ELA process uses a long and narrow shaped beam 100 to irradiate the thin film. In ELA, a line-shaped and homogenized excimer laser beam pulses are generated and scanned across the film surface. For example, the width 124 of the center portion of the ELA beam can be up to about 1 cm (typically about 0.4 mm) and the length 120 can be up to about 70 cm (typically about 400 mm) so that the beam can potentially irradiate the entire semiconductor thin film 126 in a single pass. The excimer laser light is very efficiently absorbed in, for example, an amorphous silicon surface layer without heating the underlying substrate. With the appropriate laser pulse duration (approx. 20-50 ns) and intensity (350-400 $mJ/cm^2$), the amorphous silicon layer is rapidly heated and melted; however, the energy dose is controlled so that the film is not totally melted down to the substrate. As the melt cools, recrystallization into a polycrystalline structure occurs. Line beam exposure is a multishot technique with an overlay of 90% to 99% between shots. The properties of silicon films are dependent upon the dose stability and homogeneity of the applied laser light. Line-beam exposure typically produces films with an electron mobility of 100 to 150 $cm^2/V\text{-}s$.

Figure 2:
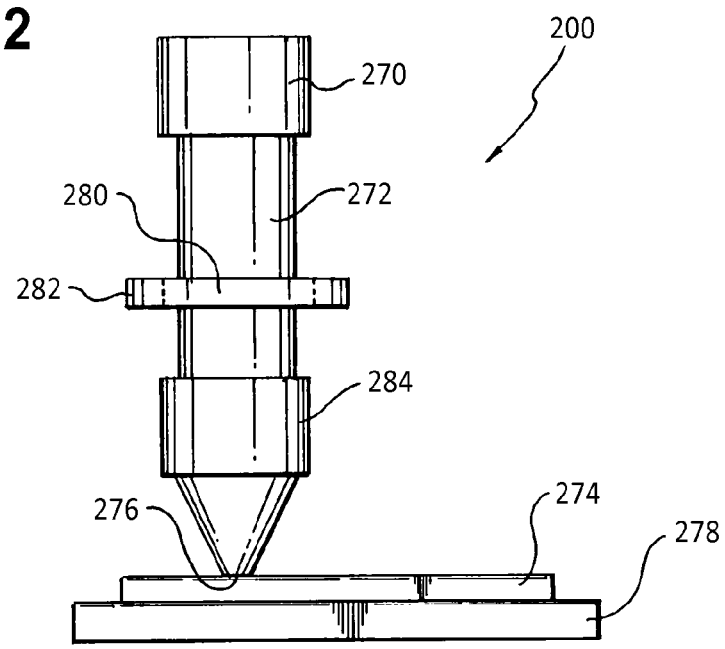
FIG. 2 shows a diagram of an exemplary system for performing a sequential lateral solidification according to one or more embodiments of the present invention.

Referring to FIG. 2, an apparatus 200 is shown that may be used for sequential lateral solidification and/or for uniform grain structure crystallization. Apparatus 200 has a laser source 270. Laser source 270 may include a laser (not shown) along with optics, including mirrors and lens, which shape a laser beam pulse 272 (shown by dotted lines) and direct it toward a substrate 274, which is supported by a stage 278. The laser beam pulse 272 passes through a mask 280 supported by a mask holder 282. The laser beam pulses 272 generated by the beam source 270 provide a beam intensity in the range of 10 $mJ/cm^2$ to 1 $J/cm^2$, a pulse duration in the range of 20 to 300 nsec, and a pulse repetition rate in the range of 10 Hz to 300 Hz. Currently available commercial lasers such as Lambda STEEL 1000 available from Lambda Physik, Ft. Lauderdale, Fla., can achieve this output. As the power of available lasers increases, the energy of the laser beam pulses 272 will be able to be higher, and the mask size will be able to increase as well. After passing through the mask 280, the laser beam pulse 272 passes through projection optics 284 (shown schematically). The projection optics 284 reduces the size of the laser beam, and simultaneously increases the intensity of the optical energy striking the substrate 274 at a desired location 276. The demagnification is typically on the order of between 3× and 7× reduction, preferably a 5× reduction, in image size. For a 5× reduction the image of the mask 280 striking the surface at the location 276 has 25 times less total area than the mask, correspondingly increasing the energy density of the laser beam pulse 272 at the location 276.

The stage 278 is a precision x-y stage that can accurately position the substrate 274 under the beam 272. The stage 278 can also be capable of motion along the z-axis, enabling it to move up and down to assist in focusing or defocusing the image of the mask 280 produced by the laser beam pulses 272 at the location 276. In another embodiment of the method of the present invention, it is preferable for the stage 278 to also be able to rotate.

In uniform grain structure (UGS) crystallization, a film of uniform crystalline structure is obtained by masking a laser beam pulse so that non-uniform edge regions of the laser beam pulse do not irradiate the film. The mask can be relatively large, for example, it can be 1 cm×0.5 cm; however, it should be smaller than the laser beam size, so that edge irregularities in the laser beam are blocked. The laser beam pulse provides sufficient energy to partially or completely melt the irradiated regions of the thin film. UGS crystallization provides a semiconductor film having an edge region and a central region of uniform fine-grained polycrystals of different sizes. In the case where the laser irradiation energy is above the threshold for complete melting, the edge regions exhibit large, laterally grown crystals. In the case where the laser irradiation energy is below the threshold for complete melting, grain size will rapidly decrease from the edges of the irradiated region. For further detail, see U.S. application Ser. No. 60/405,084, filed Aug. 19, 2002 and entitled "Process and System for Laser Crystallization Processing of Semiconductor Film Regions on a Substrate to Minimize Edge Areas, and Structure of Such Semiconductor Film Regions," which is hereby incorporated by reference.

Sequential lateral solidification is a particularly useful lateral crystallization technique because it is capable of grain boundary location-controlled crystallization and provides crystal grain of exceptionally large size. Sequential lateral solidification produces large grained semiconductor, e.g., silicon, structures through small-scale translations between sequential pulses emitted by an excimer laser. The invention is described with specific reference to sequential lateral solidification of an amorphous silicon film; however, it is understood that the benefits of present invention can be readily obtained using other lateral crystallization techniques or other film materials.

Figure 3:
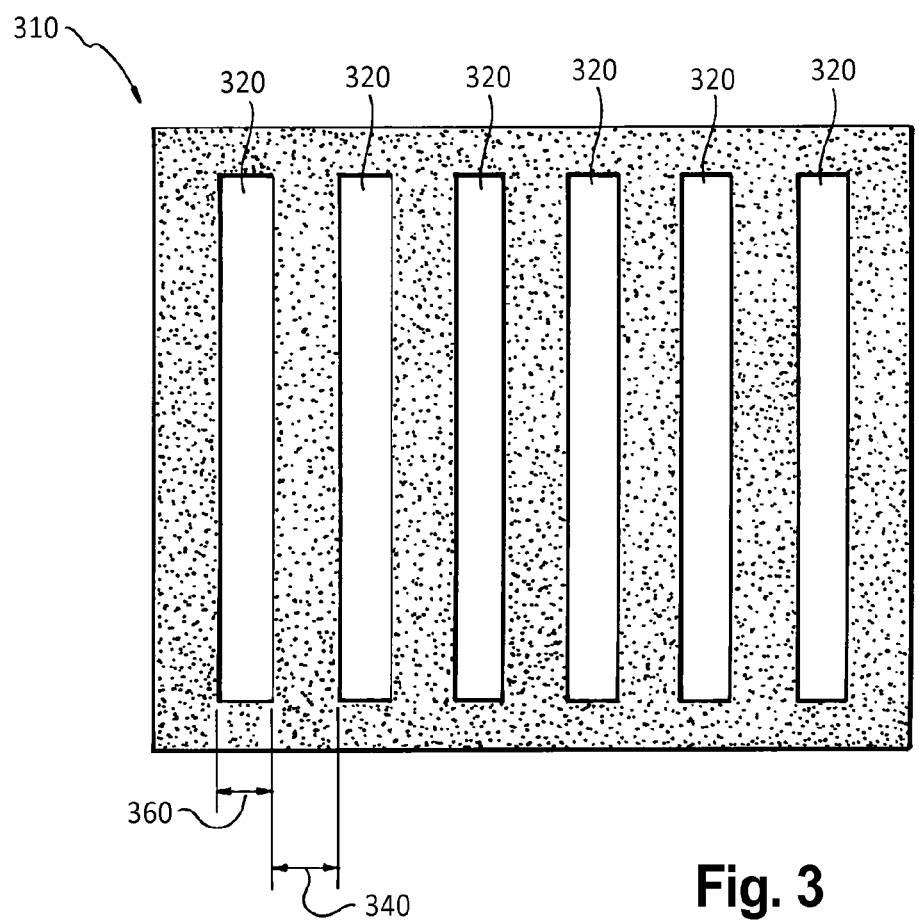
FIG. 3 shows a mask for using in a sequential lateral solidification according to one or more embodiments of the present invention

FIG. 3 shows a mask 310 having a plurality of slits 320 with slit spacing 340. The mask can be fabricated from a quartz substrate and includes a metallic or dielectric coating that is etched by conventional techniques to form a mask having features of any shape or dimension. The length of the mask features is chosen to be commensurate with the dimensions of the device that is to be fabricated on the substrate surface. The width 360 of the mask features also may vary. In some embodiments it is chosen to be small enough to avoid small grain nucleation within the melt zone, yet large enough to maximize lateral crystalline growth for each excimer pulse. By way of example only, the mask feature can have a length of between about 25 and 1000 micrometers (μm) and a width of between about two and five micrometers (μm).

An amorphous silicon thin film sample is processed into a single or polycrystalline silicon thin film by generating a plurality of excimer laser pulses of a predetermined fluence, controllably modulating the fluence of the excimer laser pulses, homogenizing the modulated laser pulses, masking portions of the homogenized modulated laser pulses into patterned beamlets, irradiating an amorphous silicon thin film sample with the patterned beamlets to effect melting of portions thereof irradiated by the beamlets, and controllably translating the sample with respect to the patterned beamlets (or vice versa) to thereby process the amorphous silicon thin film sample into a single or grain boundary-controlled polycrystalline silicon thin film.

In one or more embodiments of the sequential lateral solidification process, highly elongated crystal grains that are separated by grain boundaries that run approximately parallel to the long grain axes are produced. The method is illustrated with reference to FIG. 4 through FIG. 6.

Figure 4:
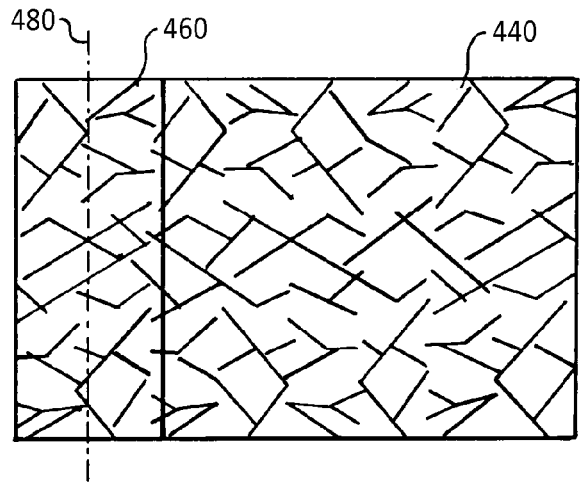
FIG. 4 illustrates a step in the process of sequential lateral solidification according to one or more embodiments of the present invention.

FIG. 4 shows the region 440 prior to crystallization. A laser pulse is directed at the rectangular area 460 causing the amorphous silicon to melt. Crystallization is initiated at solid boundaries of region 460 and continues inward towards centerline 480. The distance the crystal grows, which is also referred to as the lateral growth length, is a function of the amorphous silicon film thickness, the substrate temperature, the energy beam characteristics, the buffer layer material, if any, the mask configuration, etc. A typical lateral growth length for 50 nm thick films is approximately 1.2 micrometers. After each pulse the image of the opening is advanced by an amount not greater than the lateral growth length. In order to improve the quality of the resultant crystals, the sample is advanced much less than the lateral crystal growth length, e.g., not more than one-half the lateral crystal growth length. A subsequent pulse is then directed at the new area. By advancing the image of the slits 460 a small distance, the crystals produced by preceding steps act as seed crystals for subsequent crystallization of adjacent material. By repeating the process of advancing the image of the slits and firing short pulses the crystal grows in the direction of the slits' movement.

Figure 5:
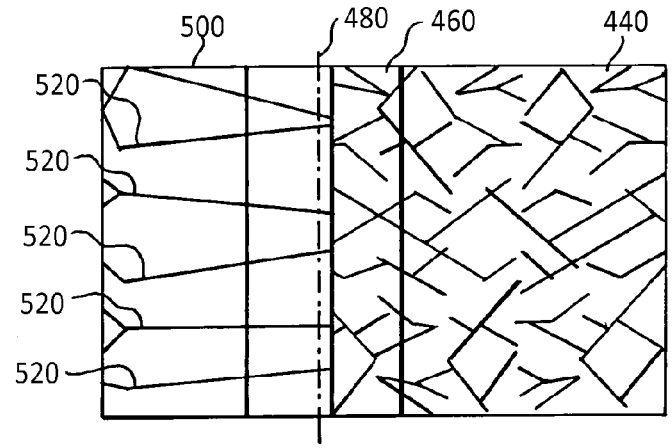
FIG. 5 illustrates a step in the process of sequential lateral solidification according to one or more embodiments of the present invention.

FIG. 5 shows the region 440 after several pulses. As is clearly shown, the area 500 that has already been treated has formed elongated crystals that have grown in a direction substantially perpendicular to the length of the slit. Substantially perpendicular means that a majority of lines formed by crystal boundaries 520 could be extended to intersect with dashed center line 480.

Figure 6:
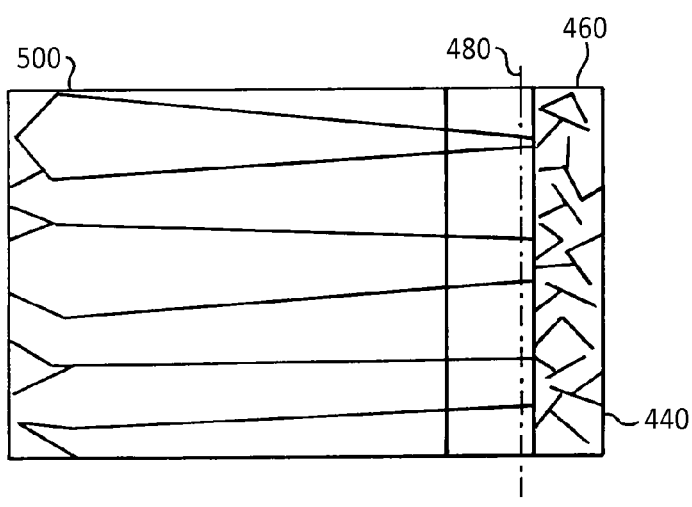
FIG. 6 illustrates a step in the process of sequential lateral solidification according to one or more embodiments of the present invention.

FIG. 6 shows the region 440 after several additional pulses following FIG. 5. The crystals have continued to grow in the direction of the slits' movement to form a polycrystalline region. The slits preferably continue to advance at substantially equal distances. Each slit advances until it reaches the edge of a polycrystalline region formed by the slit immediately preceding it.

The sequential lateral solidification process can produce a film having highly elongated, low defect grains. In one or more embodiments, this process is used to process those regions of the semiconductor thin film that are used for high performance devices. The polycrystalline grains obtained using this process are typically of high mobility, e.g., 300-400 $cm^2/V$-s. These highly elongated grains are well suited for the integrated circuitry regions on an AMLCD device.

According to the above-described method of sequential lateral solidification, the entire mask area is crystallized using multiple pulses. This method is hereinafter referred to as an "n-shot" process, alluding to the fact that a variable, or "n", number of laser pulses ("shots") are required for complete crystallization. Further detail of the n-shot process is found in U.S. Pat. No. 6,322,625, entitled "Crystallization Processing of Semiconductor Film Regions on a Substrate and Devices Made Therewith," and in U.S. Pat. No. 6,368,945, entitled "System for Providing a Continuous Motion Sequential Lateral Solidification," both of which are incorporated in their entireties by reference.

In one or more embodiments, regions of the semiconductor film are processed using a sequential lateral solidification process that produces shorter crystal grains than those of the preceding "n-shot" method. The film regions are therefore of lower electron mobility; however the film is processed rapidly and with a minimum number of passes over the film substrate, thereby making it a cost-efficient processing technique. These crystallized regions are well suited for the regions of the semiconductor thin film that are used for making pixel control devices of an AMLCD device.

Figure 7A:
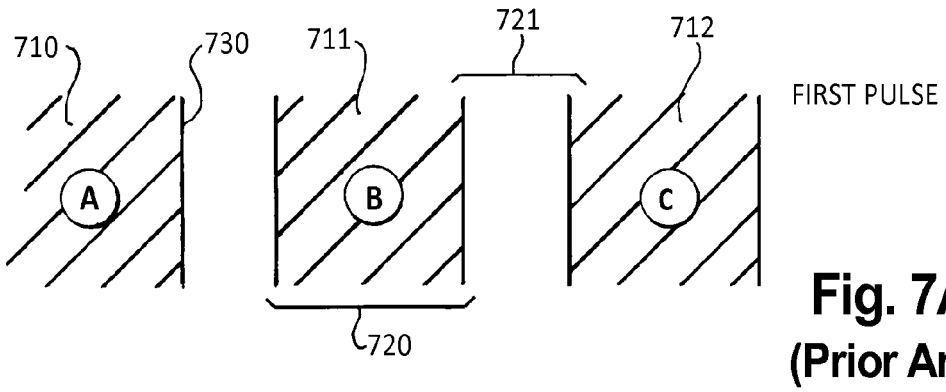
FIG. 7A through FIG. 7C illustrate a sequential lateral solidification process according to one or more embodiments of the present invention.
Figure 7B:
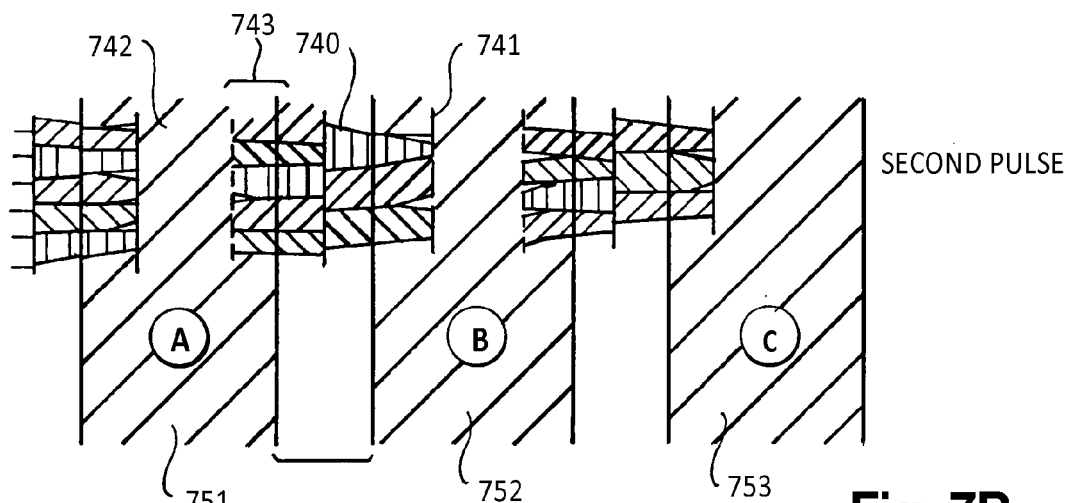

The process uses a mask such as that shown in FIG. 3, where closely packed mask slits 320 having a width 360, of about by way of example 4 μm, are each spaced apart by spacing 340 of about, by way of example, 2 μm. The sample is irradiated with a first laser pulse. As shown in FIG. 7A, the laser pulse melts regions 710, 711, 712 on the sample, where each melt region is approximately 4 μm wide 720 and is spaced approximately 2 μm apart 721. This first laser pulse induces crystal growth in the irradiated regions 710, 711, 712 starting from melt boundaries 730 and proceeding into the melt region, so that polycrystalline silicon 740 forms in the irradiated regions, as shown in FIG. 7B.

Figure 7C:
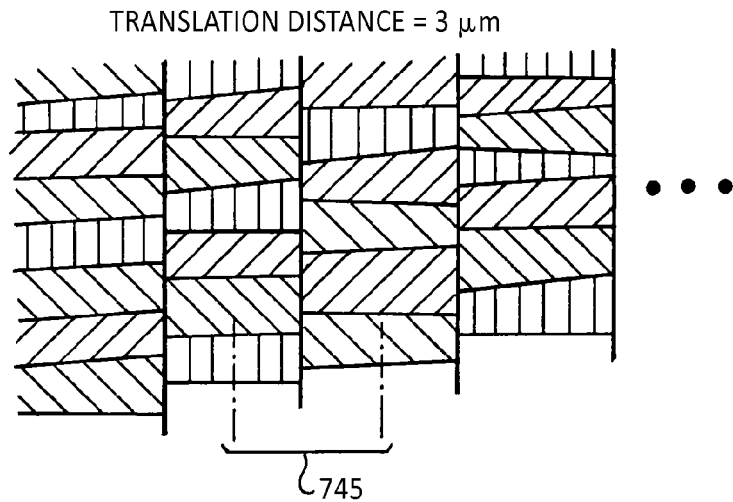

The sample is then translated approximately half the distance (or greater) of the sum of the width 360 and spacing 340, and the film is irradiated with a second excimer laser pulse. The second irradiation melts the remaining amorphous regions 742 spanning the recently crystallized region 740 and initial crystal seed region 745 to melt. As shown in FIG. 7C, the crystal structure that forms the central section 745 outwardly grows upon solidification of melted regions 742, so that a uniform long grain polycrystalline silicon region is formed.

According to the above-described method of sequential lateral solidification, the entire mask area is crystallized using only two laser pulses. This method is hereinafter referred to as a "two-shot" process, alluding to the fact that only two laser pulses ("shots") are required for complete crystallization. Further detail of the two-shot process is found in Published International Application No. WO 01/18854, entitled "Methods for Producing Uniform Large-Grained and Grain Boundary Location Manipulated Polycrystalline Thin Film Semiconductors Using Sequential Lateral Solidification," which is incorporated in its entirety by reference.

Figure 8:
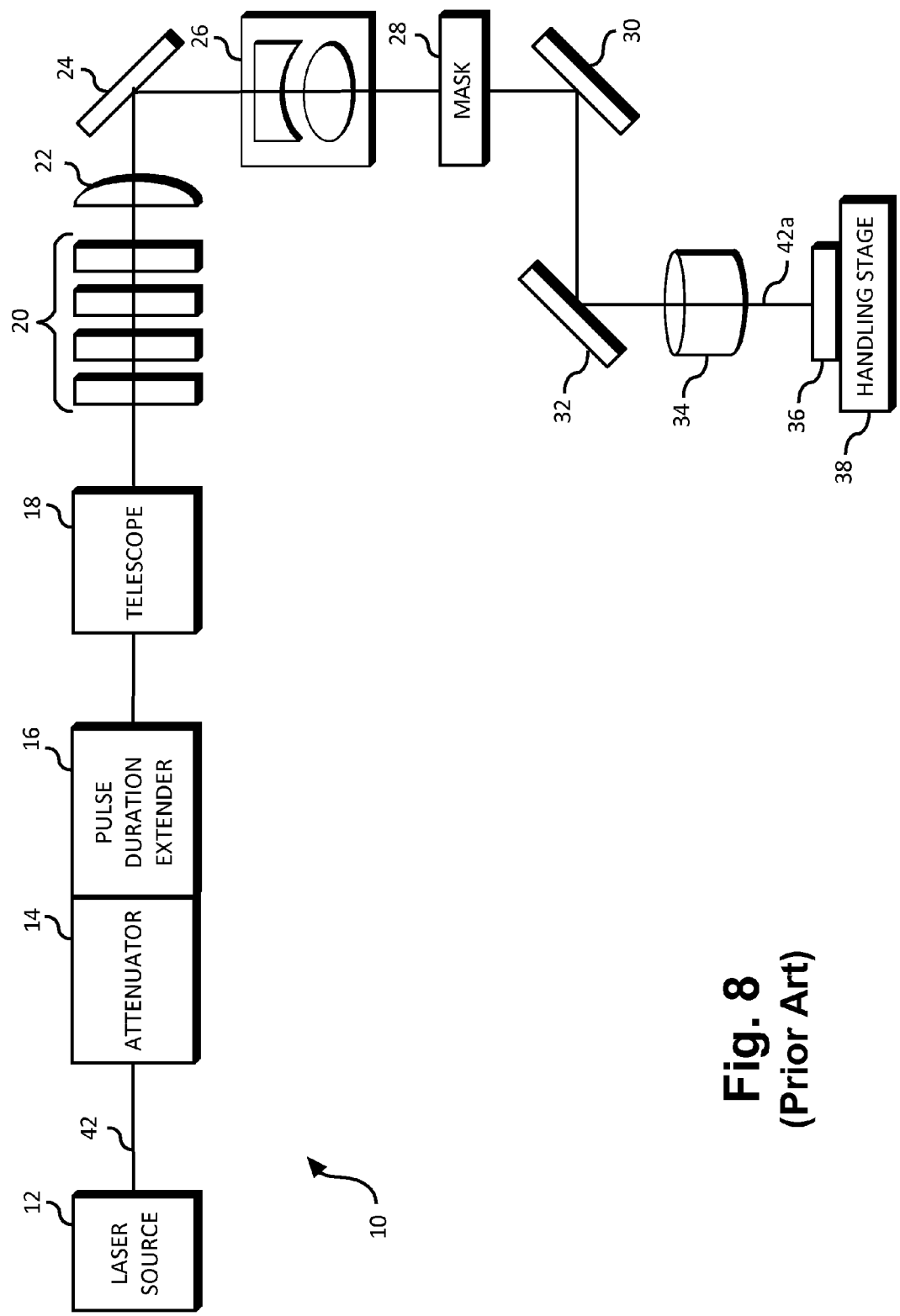
FIG. 8 is a prior art system for processing a thin film sample.

FIG. 8 illustrates a typical system 10 that can be used to induce the melting and subsequent crystallization of a thin film sample. Referring to FIG. 8, the system 10 includes a laser source 12, an attenuator 14 which is utilized in conjunction with a pulse duration extender 16, a telescope 18, a homogenizer 20, a condenser lens 22, a mirror 24, a variable-focus field lens 26, a mask 28, mirrors 30 and 32, a projection lens 34 and a handling stage 38 (i.e., a loading fixture). The laser source 12 is capable of generating laser beam pulses 42 that have set pulse durations. The attenuator 14 can be a variable attenuator, e.g., having a dynamic range of 10 to 1, capable of adjusting the energy density of the generated laser beam pulses 42. Since crystal growth can be a function of the duration of the pulse, a pulse duration extender 16 is often used to lengthen the duration of each generated laser beam pulse 42 to achieve a desired pulse duration. The telescope 18 can be used to efficiently adapt the beam profile of the laser beam pulse 42 to the aperture of the homogenizer 20. The homogenizer 20 can consist of two pairs of lens arrays (two lens arrays for each beam axis) that are capable of generating a laser beam pulses 42 that have uniform energy density profiles. The condenser lens 22 can condense the laser beam pulse 42 onto the variable-focus field lens 26. The mask 28 is typically mounted to a mask stage (not shown) that is capable of accurately positioning the mask 28 (e.g., in three dimensions) in relationship to the incoming laser beam pulse 42.

The energy beam characteristics of the laser beam pulses 42 generated by the laser source 12 are modified by the optical elements of system 10 to produce laser beam pulses 42a that have desired energy beam characteristics, e.g., beam energy profile (density), beam shape, beam orientation, beam pulse duration, etc. As previously discussed, the amorphous silicon film 36 can be deposited in a controlled manner upon a surface of a substrate (not shown). The handling stage 38 is capable of accurately positioning the thin film 36 (e.g., in three dimensions) in relation to the incoming laser beam pulses 42a. The handling stage 38 can operate in a continuous scanning mode or, alternatively, a stepper mode. Laser beam pulses 42a thus are directed to portions of the thin film sample to induce the melting and subsequent crystallization of the thin film sample, e.g., via two-shot or n-shot SLS processing.

As discussed above, to achieve a laser beam pulse 42a that has acceptable energy beam characteristics, many systems today utilize a pulse duration extender 16 to extend the pulse duration of the laser beam pulses 42 that are generated by the laser source 12. When using a pulse duration extender, however, some of the energy of the generated laser beam pulse 42 will become lost during the "extension" process since pulse duration extenders tend to be inefficient (e.g., the efficiencies of a pulse duration extender may range from between 50-80%). This inability to utilize all of the energy which is generated by the laser source can lead to increased processing times and, thus, lower manufacturing throughput. System 10 also suffers from the disadvantage that only a single thin film sample can be processed (i.e., irradiated) at a time.

Figure 9:
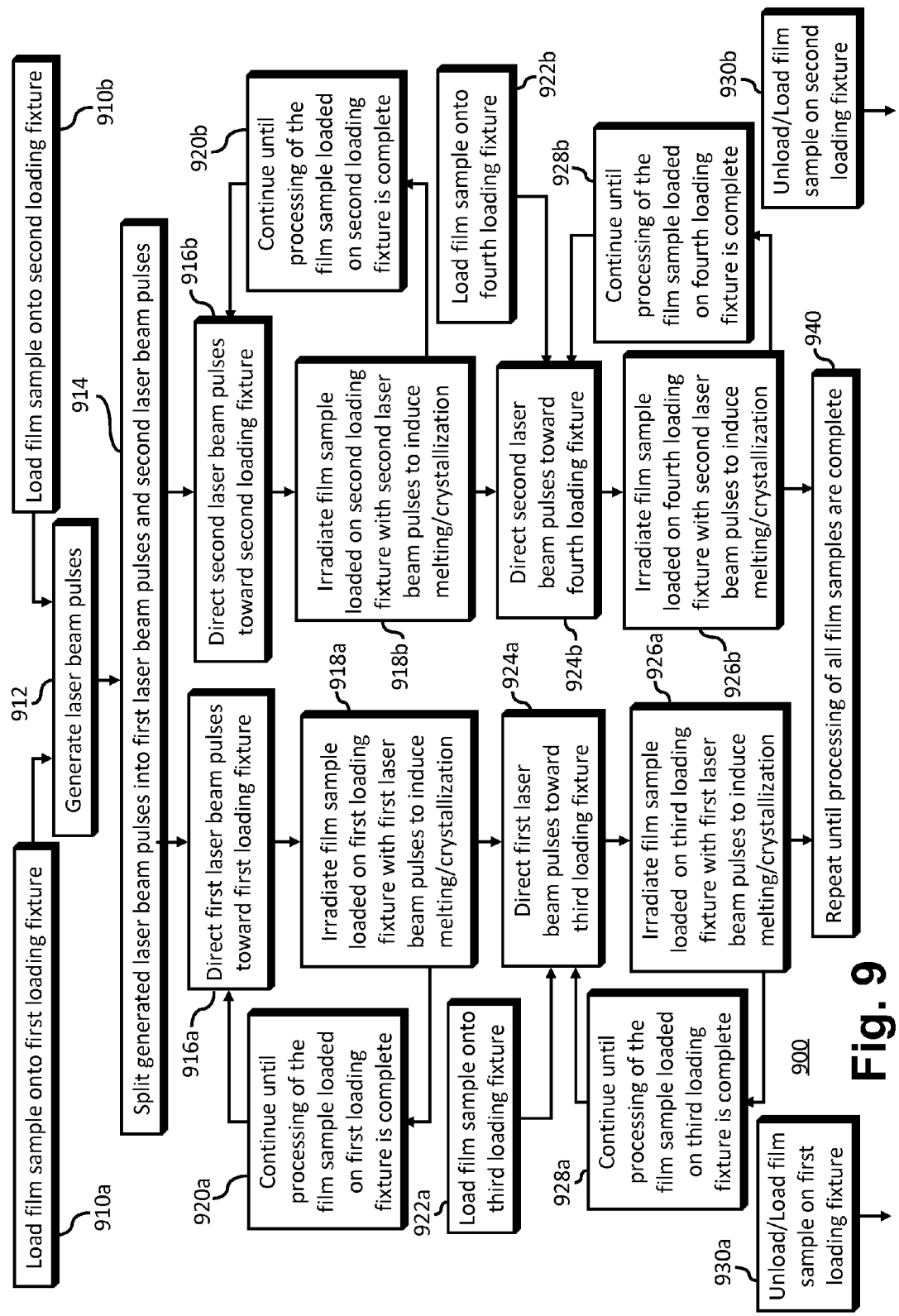
FIG. 9 is a flow chart of an exemplary embodiment of a process according to the present invention in which more than one thin film sample is irradiated at a time.

Exemplary systems and processes according to the present invention can employ principles and components thereof to process more than one thin film sample at a time. An exemplary process is set forth in the flow diagram 900 of FIG. 9. Flow diagram 900 illustrates a method for simultaneously irradiating two thin film samples that are located on separate handling stages (i.e., loading fixtures) while other thin film samples are being unloaded from and loaded onto other handling stages.

In steps 910a and 910b, thin film samples (which may be mounted on substrates) are loaded onto a first loading fixture and a second loading fixture, respectively. The deposition and/or fabrication of a thin film on a substrate is well known in the art. In step 912 laser beam pulses are generated. In step 914 the generated laser beam pulses are split into first laser beam pulses and second laser beam pulses. In certain preferred embodiments, the first and second laser beam pulses have pulse durations that are substantially the same. In step 916a the first laser beam pulses are directed to the first loading fixture and the thin film sample loaded on the first loading fixture is irradiated with the first laser beam pulses to induce the melting and subsequent crystallization of the thin film sample, step 918a. In step 916b the second laser beam pulses are directed to the second loading fixture and the thin film sample loaded on the second loading fixture is irradiated with the second laser beam pulses to induce the melting and subsequent crystallization of the thin film sample, step 918b. In an exemplary embodiment, at least a portion of the thin film loaded on the first loading fixture is also being irradiated (steps 916a and 918a) while at least a portion of the thin film loaded on the second loading fixture is also being irradiated (steps 916b and 918b). Thus, in this manner, more than one thin film sample can be processed simultaneously. The processing of the thin film sample loaded on the first loading fixture is continued until the processing is complete, step 920a. Similarly, the processing of the thin film sample loaded on the second loading fixture is also continued until the processing is complete, step 920b. In certain embodiments, the (total) processing of the thin film sample loaded on the first loading fixture coincides with the processing of the thin film sample loaded on the second loading fixture. In other embodiments, however, the processing of the thin film sample loaded on the first loading fixture does not coincide with the processing of the thin film sample loaded on the second loading fixture.

While the processing of the thin film samples loaded on the first and second loading fixtures is underway, other thin film samples are loaded onto a third loading fixture, step 922a, and onto a fourth loading fixture, step 922b. Thus, while a thin film sample is being processed (i.e., irradiated), the unloading/loading of another thin film sample onto an inactive (i.e., receiving no irradiation) loading fixture can be accomplished. Upon completing the processing of the thin film sample which is loaded on the first loading fixture, the first laser beam pulses are then directed to the third loading fixture, step 924a, (where a thin film sample has already been loaded (step 922a)) and the unloading of the processed thin film sample and the loading of a new thin film sample onto the first loading fixture, step 930a, begins. Upon completing the processing of the thin film sample which is loaded on the second loading fixture, the second laser beam pulses are directed to the fourth loading fixture, step 924b, (where a thin film sample has already been loaded (step 922b)) and the unloading of the processed thin film sample and the loading of a new thin film sample onto the second loading fixture, step 930b, begins.

In step 926a the thin film sample loaded on the third loading fixture is then irradiated with the first laser beam pulses to induce the melting and subsequent crystallization of the loaded thin film sample. In step 926b the thin film sample loaded on the fourth loading fixture is then irradiated with the second laser beam pulses to induce the melting and subsequent crystallization of this thin film sample. The processing of the thin film samples loaded on the third and fourth loading fixtures is then continued until the processing is complete, steps 928a and 928b, respectively. Preferably, a new thin film sample is already loaded onto the first loading fixture, step 930a, before the processing of the thin film sample loaded on the third loading fixture is completed. And, preferably, a new thin film sample is already loaded onto the second loading fixture, step 930b, before the processing of the thin film sample loaded on the fourth loading fixture is completed. This method of unloading/loading thin film samples from/onto inactive loading fixtures, while other thin film samples are being processed on active loading fixtures, is continued until all the thin film samples have been processed, step 940. Flow diagram 900 thus provides a method for optimally using the power provided by the laser source and for maximizing the manufacturing throughput of the thin film processing. This is accomplished by maximizing the laser (irradiation) source's duty cycle, e.g., the laser source can remain on and its generated energy is continuously being utilized to facilitate the processing of thin film samples, and minimizing any downtime that may be necessary for the loading and unloading of the thin film samples onto and from the loading fixtures.

Figure 10:
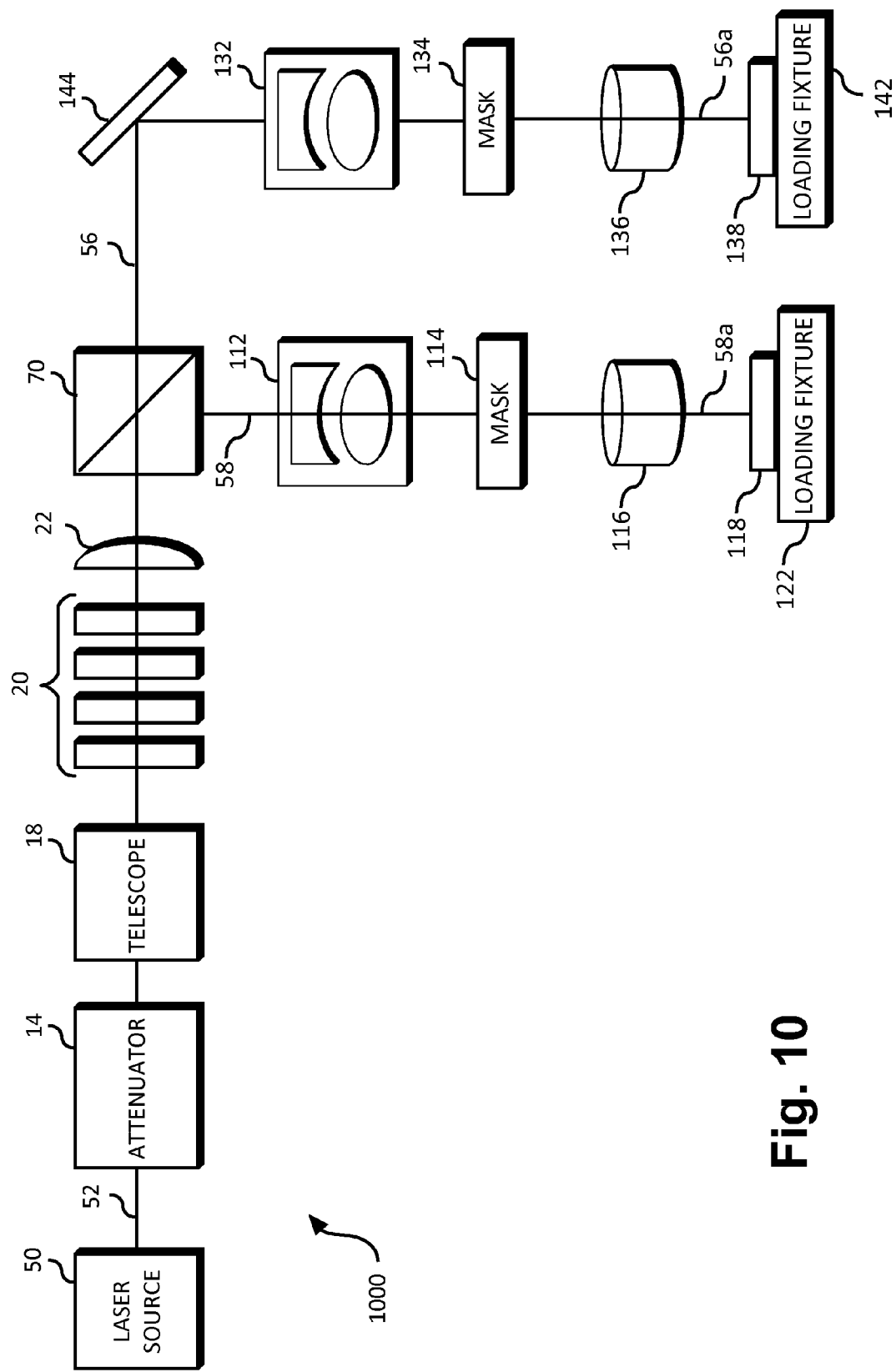
FIG. 10 depicts an exemplary system for processing a plurality of thin film sample in accordance with the present invention.

An exemplary embodiment of a system constructed in accordance with the present invention is depicted in FIG. 10. System 1000 of FIG. 10 includes a laser source system 50, a beam splitting element 70 and two loading fixtures 122, 142. Thin film samples 118, 138 are loaded onto loading fixtures 122 and 142, respectively. System 1000 may further include an automatic handling system(s) (not shown) that is capable of loading the thin film samples onto the loading fixtures, so that the thin film samples may be processed, and removing the thin film samples from the loading fixtures when processing has been completed. The laser source system 50 is capable of generating laser beam pulses 52 that have sufficient energy to process (upon splitting) at least two thin film samples at the same time. Moreover, in most preferred embodiments, the laser source system 50 is capable of generating laser beam pulses 52 which have pulse durations that are sufficient to induce the desired crystallization processing of the thin film samples. Thus, in most preferred embodiments, a pulse duration extender does not need to be utilized to extend the pulse duration of the laser beam pulses 52 generated by the laser source system 50.

System 1000 further includes a variable-focus field lens 112, a mask 114, a projection lens 116, a mirror 144, a second variable-focus field lens 132, a second mask 134 and a second projection lens 136. Variable-focus field lens 112, mask 114 and projection lens 116 are disposed between the beam splitting element 70 and the loading fixture 122, while variable-focus field lens 132, mask 134 and projection lens 136 are disposed between the beam splitting element 70 and the loading fixture 142. In other embodiments, system 1000 may include different (or fewer) optical elements. Moreover, different optical elements may be present within the different optical paths that are located downstream of the beam splitting element 70. Accordingly, the energy beam characteristics of the laser beam pulses that are used to irradiate the thin film samples can be tailored to meet the processing requirements of the thin samples that are to be processed. System 1000 further includes an attenuator 14, a telescope 18, a homogenizer 20 and a condenser lens 22, which are located between the laser source system 50 and the beam splitting element 70.

After traveling through the attenuator 14, telescope 18, homogenizer 20 and condenser lens 22 (where the energy beam characteristics of the laser beam pulses 52 are accordingly modified), laser beam pulses 52 are then split by the beam splitting element 70 into first laser beam pulses 58 and second laser beam pulses 56 which are directed to the first loading fixture 122 and the second loading fixture 142, respectively. The beam splitting element 70 "splits" the laser beam pulses 52 by distributing the energy density of the laser beam pulses 52 into separate component laser beam pulses 56 and 58. The component laser beam pulses 56 and 58 produced by the beam splitting element 70 generally will have the same pulse durations as the laser beam pulses 52 which are generated by the laser source system 50. Component laser beam pulses 56 and 58, however, need not have the same energy densities. For example, in some embodiments, 60% of the energy density of the laser beam pulses 52 may be used to form the first laser beam pulses 58 while, in other embodiments, the energy densities of the component laser beam pulses 56 and 58 may be substantially the same. While the beam splitting element 70 of system 1000, as shown, only generates two component laser beam pulses, in other embodiments the beam splitting element 70 is capable of producing several (e.g., three, four, etc.) component laser beam pulses from the laser beam pulses 52 that are generated by the laser source system 50.

First laser beam pulses 58 travel through variable-focus lens 112, mask 114 and projection lens 116 to form first laser beam pulses 58a (e.g., the energy beam characteristics of laser beam pulses 58a will be different than that of laser beam pulses 58). Thin film 118, which is loaded on loading fixture 122, is then irradiated with the laser beam pulses 58a. The loading fixture 122 is capable of accurately positioning the thin film 118 (e.g., in three dimensions) in relation to the incoming first laser beam pulses 58a. The loading fixture 122 can operate in a continuous scanning mode or, alternatively, a stepper mode. Laser beam pulses 58a thus are directed to portions of thin film 118 to induce the melting and subsequent crystallization of the thin film 118, e.g., via two-shot or n-shot SLS processing. Upon completing the processing of the thin film 118 loaded on loading fixture 122, the thin film 118 is then removed from loading fixture 122 and another thin film sample is substituted in its place.

Second laser beam pulses 56 similarly travel through variable-focus lens 132, mask 134 and projection lens 136 to form second laser beam pulses 56a (e.g., the energy beam characteristics of laser beam pulses 56a will be different than that of laser beam pulses 56). Thin film 138, which is loaded on loading fixture 142, is then irradiated with the laser beam pulses 56a. The loading fixture 142 is capable of accurately positioning the thin film 138 (e.g., in three dimensions) in relation to the incoming second laser beam pulses 56a. Loading fixture 142 can operate in a continuous scanning mode or, alternatively, a stepper mode. Laser beam pulses 56a thus are directed to portions of thin film 138 to induce the melting and subsequent crystallization of the thin film 138, e.g., via two-shot or n-shot SLS processing. Upon completing the processing of the thin film 138 loaded on loading fixture 142—which need not coincide with the processing of the thin film 118 that is loaded on loading fixture 122—thin film 138 can be removed from the loading fixture 142 and another can be substituted in its place. The operations of the laser source system 50, the beam steering element 70, and the handling stages 122, 142, along with the systems (e.g., actuators, conveyors, etc) necessary for loading and unloading the thin film samples onto and from the loading fixtures 122, 142, and the other optical elements (if present) can be controlled by a programmable computer system (not shown). FIG. 10 thus illustrates a system for processing thin film samples where two thin film samples can be processed at the same time.

In an alternate embodiment, system 1000 can be configured so as to simultaneously irradiate different portions of a single thin film sample (loaded on a loading fixture). In other words, in certain embodiments, system 1000 may only include a single loading fixture and laser beam pulses 56a and 58a can be directed to different regions of the thin film that is loaded on the loading fixture. Thus, simultaneous processing of different regions of a thin film sample can be accomplished in accordance with the teachings of the present invention.

As previously discussed, laser source system 50 is preferably capable of generating laser beam pulses 52 that have sufficient energy to process (upon splitting) more than one thin film samples at a time. In most exemplary embodiments, the laser source system 50 has a high pulse-to-pulse stability, e.g., less than 3% and preferable less than 1.5%. Moreover, in most preferred embodiments, the laser source system 50 is capable of generating laser beam pulses 52 which have pulse durations that are sufficient to induce the desired crystallization processing of the thin film samples. Thus, in certain preferred embodiments, a pulse duration extender does not need to be utilized to extend the pulse duration of the laser beam pulses 52 generated by the laser source system 50. Appropriate laser source systems that are capable of producing laser beam pulses 52 which have sufficient energy to process more than one thin film sample at a time are commercially available. For example, in certain embodiments, the laser source system 50 of the present invention can be a high-pulse-energy excimer laser, such as the Lambda STEEL systems that are available from Lambda Physik or the SOPRA VEL 1510 that is available from SOPRA S.A.

Figure 11:
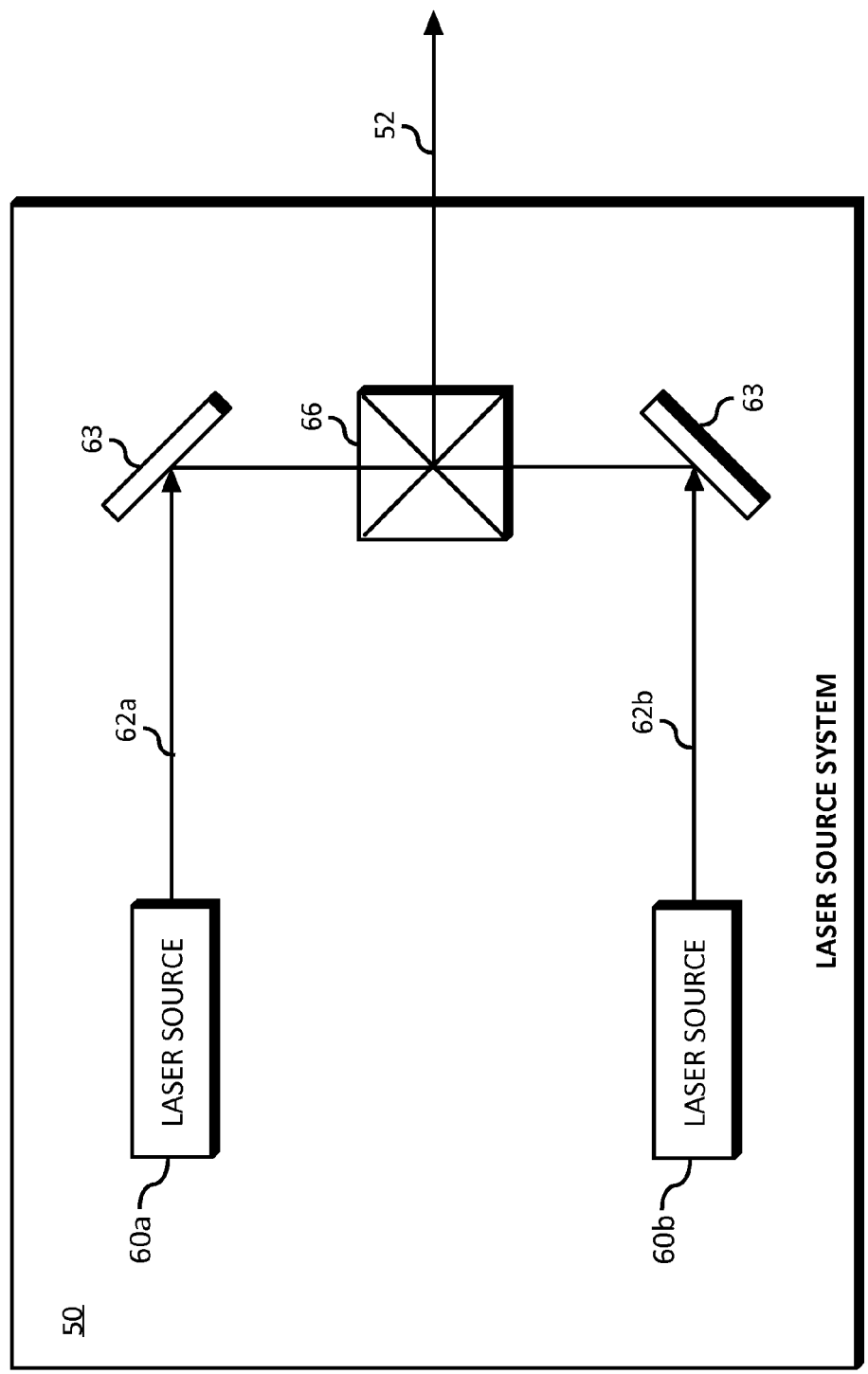
FIG. 11 depicts an exemplary laser source system for generating laser beam pulses in accordance with the present invention.
Figure 12C:
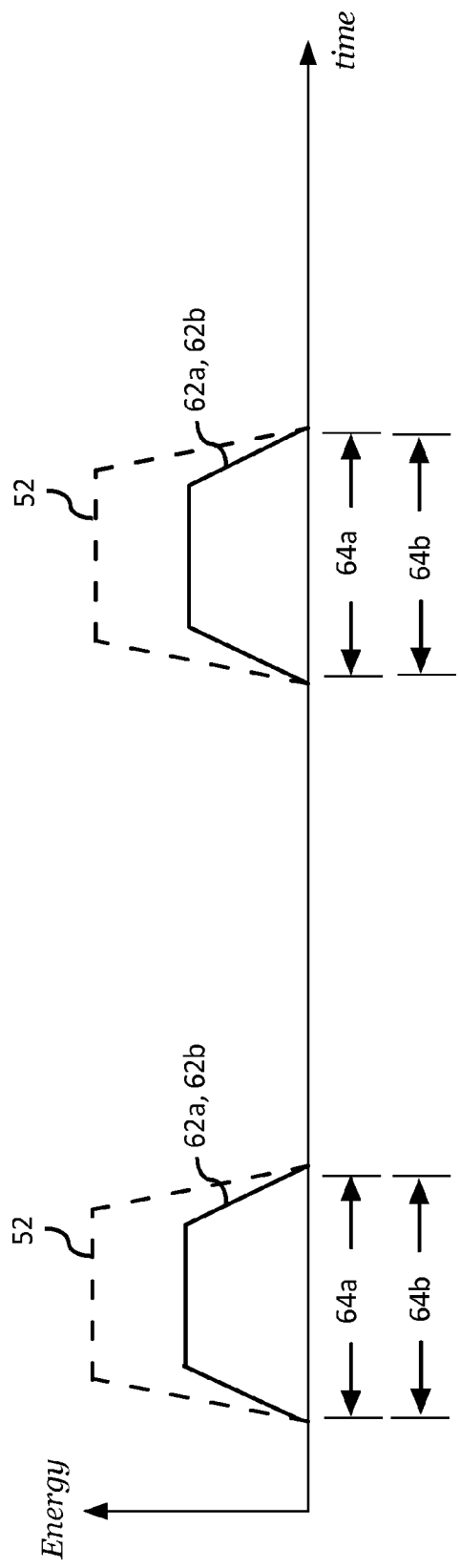

In other exemplary embodiments, the laser source system 50 includes two or more laser sources that generate component laser beam pulses that are integrated together to form the laser beam pulses 52. FIG. 11 illustrates one exemplary embodiment of a laser source system 50 that utilizes two or more laser sources. FIGS. 12A-C illustrate various ways in which the component laser beam pulses of the laser source system 50 of FIG. 11 can be integrated to form laser beam pulses 52. The laser source system 50 of FIG. 11 includes a first laser source 60*a*, a second laser source 60*b*, mirrors 63 and an integrator 66. Referring to FIGS. 11 and 12A, the first laser source 60*a* generates component laser beam pulses 62*a* that have an energy profile, pulse cycle and pulse duration 64*a* as shown. The second laser source 60*b* generates component laser beam pulses 62*b* that have an energy profile, pulse cycle and pulse duration 64*b* as shown. In certain preferred embodiments, the energy profiles, pulse cycles and pulse durations 64*a*, 64*b* of the component laser sources 60*a*, 60*b* are substantially similar, while in other embodiments, the energy profiles, pulse cycles and/or pulse durations are different. The laser beam pulses 62*a*, 62*b* are directed to the integrator 66 via mirrors 63. The integrator 66 combines laser beam pulses 62*a*, 62*b* together to form laser beam pulses 52 having an effective pulse duration as shown in FIGS. 12A-C. The integrator 66 can include reflective elements that direct the laser beam pulses 62*a*, 62*b* onto the same optical path. As seen in FIGS. 12A-C, each component laser beam pulse 62*a* (having a pulse duration 64*a*) is integrated (i.e., paired) with a corresponding component laser beam pulse 62*b* (having a pulse duration 64*b*) to effectively form a laser beam pulse 52. The component laser beam pulses 62*a*, 62*b* can be integrated together so that (1) there is a small time delay between a laser beam pulse 62*a* and a corresponding laser beam pulse 62*b*, (2) a portion of a laser beam pulse 62*a* overlies a portion of a corresponding laser beam pulse 62*b* so that the laser beam pulse 62*a*, 62*b* are constructively added where they overlie each other, or (3) a laser beam pulse 62*a* completely overlies a corresponding laser beam pulse 62*b* (and, thus, laser beam pulse 62*a*, 62*b* constructively add to each other). The integration of the component laser beam pulses 62*a*, 62*b* (to form a laser beam pulse 52) can be controlled, for example, by varying the timing of the generation of the component laser beam pulses 62*a*, 62*b* (with respect to each other), the pulse cycle at which the component laser beam pulses 62*a*, 62*b* are being generated, the length of the pulse durations 64*a*, 64*b* of the component laser beam pulses 62*a*, 62*b*, the path lengths found between the laser sources 60*a*, 60*b* and the integrator 60, the operations of the integrator 60 (e.g., delayed biases, if present), or the energy densities of the component laser beam pulses 62*a*, 62*b*.

As shown in FIG. 12A, in certain exemplary embodiments, a time delay d is inter-disposed between corresponding component laser beam pulses 62*a*, 62*b*. In one preferred embodiment, the laser sources 60*a*, 60*b* are synchronized to produce laser beam pulses 62*a*, 62*b* at substantially identical frequencies (e.g., 300 hz) with a timed separation delay (e.g. 50-500 nanoseconds) occurring between the generation of a laser beam pulse 62*a* and a corresponding laser beam pulse 62*b*. In other words, laser source 60*a* generates a first laser beam pulse 62*a* while laser source 60*b* generates a first laser beam pulse 62*b* shortly thereafter. The integrator 66 then combines the first laser beam pulse 62*a* with the first laser beam pulse 62*b* to form a first laser beam pulse 52, as shown in FIG. 12A. In the embodiment depicted in FIG. 12A, the resulting pulse duration of a generated laser beam pulse 52 is thus the sum of the pulse durations 64*a*, 64*b* (corresponding to laser beam pulses 62*a*, 62*b*, respectively) and the time delay d. Laser sources 60*a*, 60*b* then continue to generate additional laser beam pulses 62*a*, 62*b*, respectively, and the integrator 66 combines the corresponding laser beam pulses 62*a*, 62*b* together to form the laser beam pulses 52.

FIG. 12B shows an embodiment where a component laser beam pulse 62*b* partially overlaps a corresponding laser beam pulse 62*b* to form an integrated laser beam pulse 52, while FIG. 12C shows an embodiment where a component laser beam pulse 62*b* completely overlaps a corresponding laser beam pulse 62*b* to form an integrated laser beam pulse 52. In the area where the component laser beam pulses 62*a*, 62*b* are constructively added (i.e., where they overlap), the resulting energy profile of the laser beam pulse 52 is indicated with a dashed line. In the embodiment depicted in FIG. 12B, since the component laser beams pulse 62*a* only partially overlap with the corresponding component laser beam pulses 62*b*, the resulting pulse durations of the integrated laser beam pulses 52 will be less than the sum of the pulse durations 64*a*, 64*b* (corresponding to laser beam pulses 62*a*, 62*b*, respectively). In the embodiment depicted in FIG. 12C, the resulting pulse durations of the integrated laser beam pulses 52 will be equal to the longer of the two pulse durations 64*a*, 64*b* (corresponding to laser beam pulses 62*a*, 62*b*, respectively) since the component laser beams pulse 62*a* fully overlap with the corresponding component laser beam pulses 62*b*.

Figure 13:
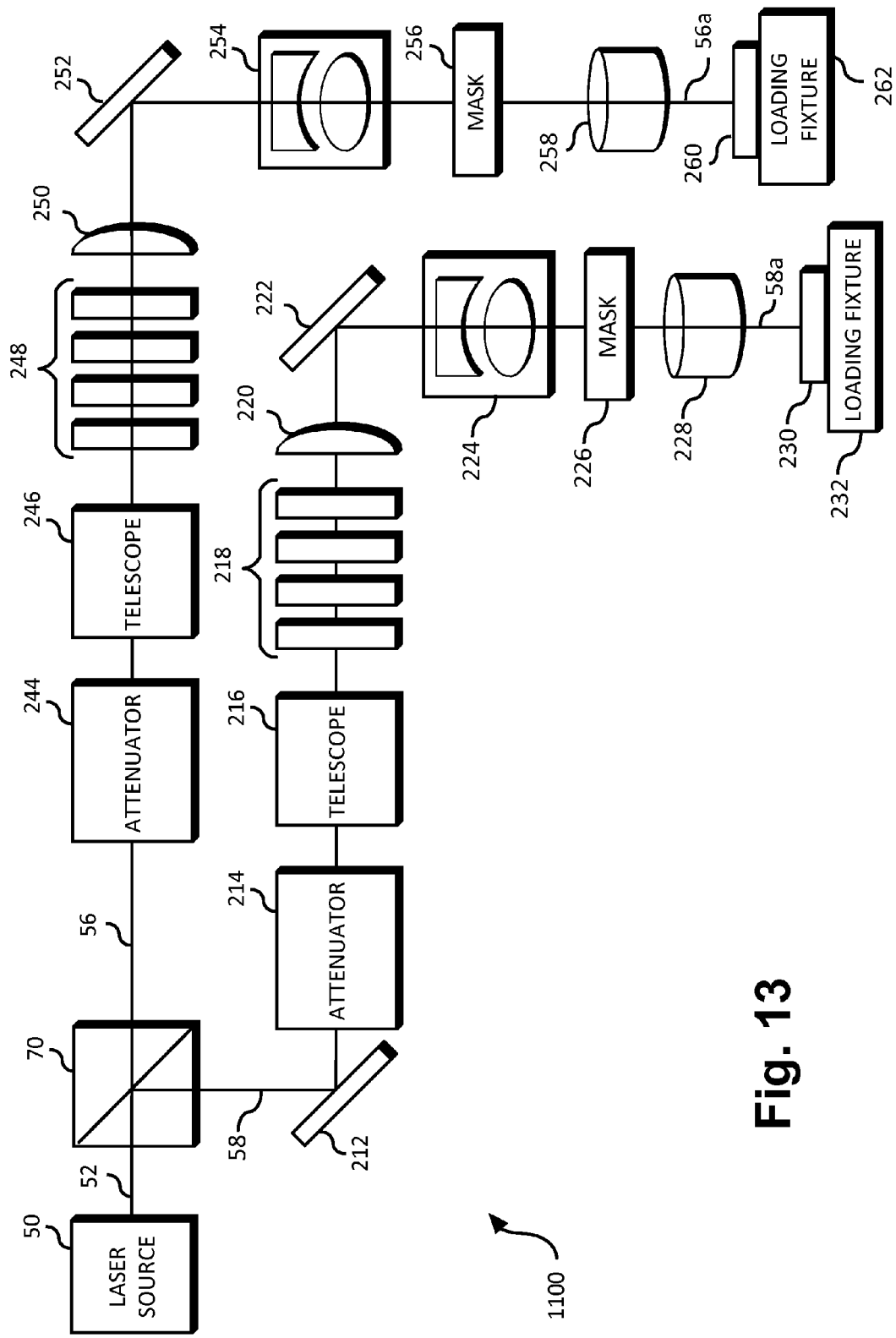
FIG. 13 depicts another exemplary system for processing a plurality of thin film sample in accordance with the present invention.

FIG. 13 depicts another exemplary embodiment of a system constructed in accordance with the present invention. System 1100 of FIG. 13 is similar to system 1000 of FIG. 10 except that the optical elements (e.g., attenuators, telescopes, homogenizers, condenser lenses, etc.) have been moved downstream of the beam splitting element 70. Thin films 230 and 260 are loaded onto loading fixtures 232 and 262, respectively. Mirrors 212, 222, attenuator 214, telescope 216, homogenizer 218, condenser lens 220, variable-focus field lens 224, mask 226, and projection lens 228 are disposed (along an optical path) between the beam splitting element 70 and the loading fixture 232. Attenuator 244, telescope 246, homogenizer 248, condenser lens 250, mirror 252, variable-focus field lens 254, mask 256, and projection lens 258 are similarly disposed (along a different optical path) between the beam splitting element 70 and the loading fixture 262. The laser source system 50 is capable of generating laser beam pulses 52 that have sufficient energy to process (upon splitting) at least two thin film samples at the same time. Moreover, the laser source system 50 is capable of generating laser beam pulses 52 which have pulse durations that are sufficient to induce the desired crystallization processing of the thin film samples.

Laser beam pulses 52 are split by the beam splitting element 70 into first laser beam pulses 58 and second laser beam pulses 56 which are directed to the first loading fixture 232 (and thin film 230 which is disposed thereon) and the second loading fixture 262 (and thin film 260 which is disposed thereon), respectively. First laser beam pulses 58 travel through attenuator 214, telescope 216, homogenizer 218, condenser lens 220, variable-focus field lens 224, mask 226, and projection lens 228 to form first laser beam pulses 58a (e.g., the energy beam characteristics of laser beam pulses 58a will tend to be different than that of laser beam pulses 58). The thin film 230 that is loaded on loading fixture 232 is then irradiated by the laser beam pulses 58a. Upon completing the processing of thin film 230, the thin film 230 can be removed from the loading fixture 232 and another can be substituted in its place. Second laser beam pulses 56 similarly travel through attenuator 244, telescope 246, homogenizer 248, condenser lens 250, variable-focus field lens 254, mask 256, and projection lens 258 to form second laser beam pulses 56a (e.g., the energy beam characteristics of laser beam pulses 56a will tend to be different than that of laser beam pulses 56). The thin film 260 that is loaded on loading fixture 262 is then irradiated by the laser beam pulses 56a. The loading fixtures 232, 262 (and thus the corresponding thin films 230, 262) may be located within the same irradiation chamber or separate irradiation chambers depending, for example, upon the operational conditions (e.g., pressure, temperature, etc.) that are to be maintained at the different loading fixtures 232 and 262. Upon completing the processing of thin film 260—which need not coincide with the processing of the thin film 230—the thin film 260 can be removed from the loading fixture 262 and another can be substituted in its place. System 1100 provides additional flexibility in controlling the energy beam characteristics of the laser beam pulses 58a and 56a to match the irradiation processing requirements of the thin film samples that are being irradiated on loading fixtures 232 and 262, respectively. In other words, by placing more of the optical elements downstream of the beam splitting element 70, the energy beam characteristics of the laser beam pulses 56a, 58a can be more easily tailored to meet the (e.g., different) operational requirements of the thin film samples that are being processed.

Figure 14:
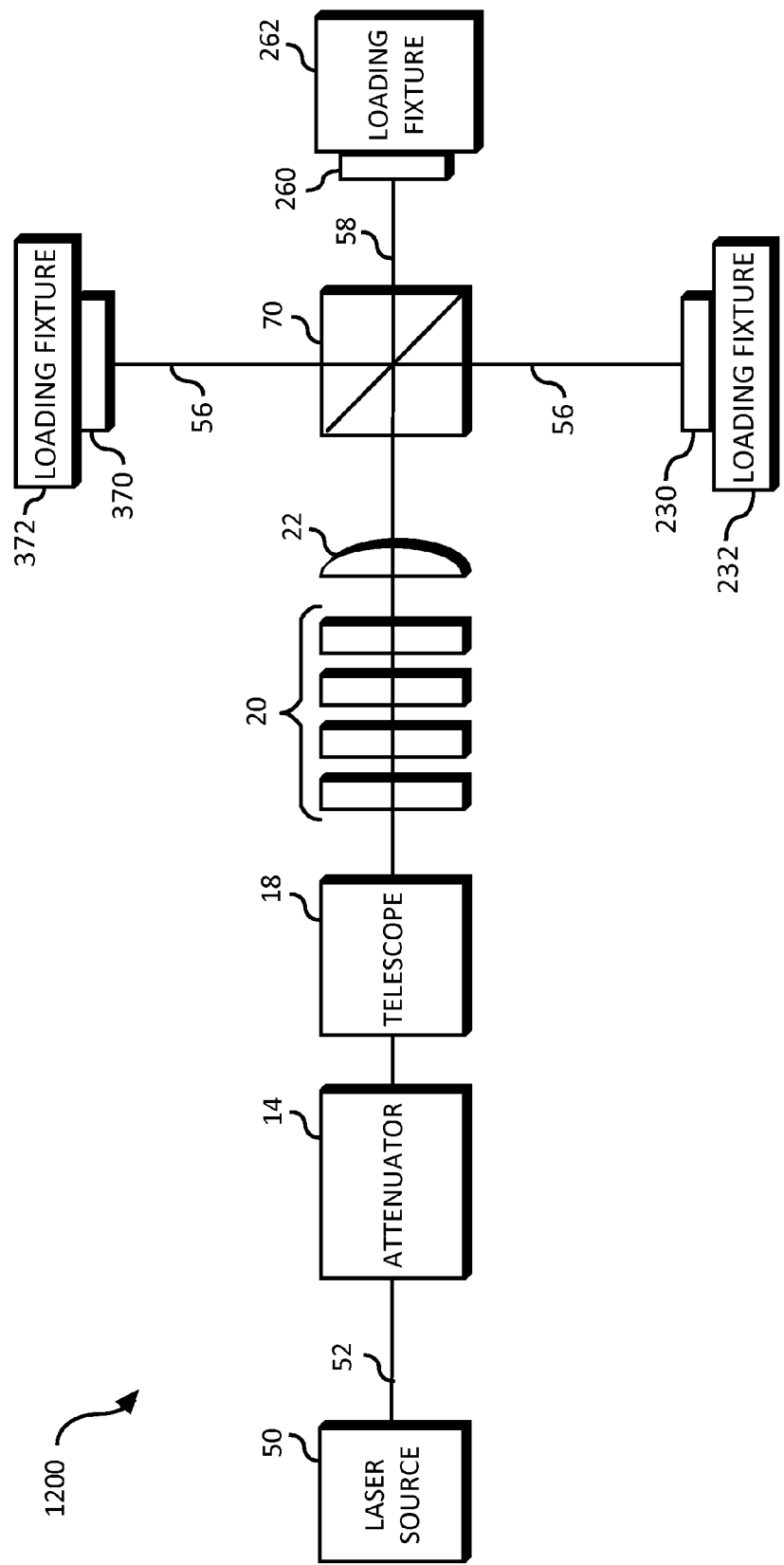
FIG. 14 depicts an exemplary system for processing a plurality of thin film sample in accordance with the present invention where thin film samples are loaded and unloaded onto a loading fixture while thin film samples are being processed on other loading fixtures.

FIG. 14 depicts yet another exemplary embodiment of a system constructed in accordance with the present invention. System 1200 of FIG. 14 is different from the systems of FIGS. 10 and 13 in that it includes a third loading fixture. Preferably, at any given moment, two of the loading fixtures are being utilized for processing (i.e., irradiating) thin film samples while other thin film samples are being unloaded and loaded onto the third loading fixture. System 1200 includes a laser source system 50, an attenuator 14, a telescope 18, a homogenizer 20, a condenser lens 22, a beam splitting element 70 and three loading fixtures, fixtures 232, 262 and 372. Other optical elements (not shown), e.g., masks, projection lens, etc, as previously discussed, can be disposed between the beam splitting element 70 and the respective loading fixtures 232, 262, and 372. The laser beam pulses 52 that are generated by the laser source system 50 enter the beam splitting element 70 after passing through the optical elements as shown. Beam splitting element 70 splits the laser beam pulses 52 into first laser beam pulses 58 and second laser beam pulses 56 as previously discussed. However, in addition to splitting laser beam pulses 52, beam splitting element 70 of system 1200 is also capable of directing the spilt laser beam pulses 56, 58 along the different optical paths which lead to the thin film samples that are loaded on the loading fixtures 232, 262, and 372. Since the beam splitter element 70 of system 1200 only produces two component laser beam pulses 56, 58 and there are three loading fixtures, at any given moment at least one of the loading fixtures 232, 262, 372 is not receiving a component laser beam pulse 56 or 58.

While a particular loading fixture is not receiving a component laser beam pulse 56 or 58, a previously processed thin film sample can be unloaded from this loading fixture and an unprocessed thin film sample can then be loaded. Once a thin film sample has been loaded onto this loading fixture and the irradiation processing of a thin film sample that is loaded on a different loading fixture has been completed, the component laser beam pulses previously directed to the other loading fixture can then be directed, via the beam splitting element 70, to the now loaded thin film sample. For example, as shown in FIG. 14, first laser beam pulses 58 are initially directed to loading fixture 262 (having thin film 260 disposed thereon) and second laser beam pulses 56 are initially directed to loading fixture 232 (having thin film 230 disposed thereon). While thin films 230 and 260 are being irradiated on loading fixtures 232 and 262, respectively, a thin film can be unloaded (if a processed thin film is present) and new thin film 370 can be loaded onto the inactive loading fixture 372. The processing of the thin films 230, 260 loaded on loading fixtures 232, 262 can be performed concurrently or, alternatively, the processing of thin film 230 loaded on loading fixture 232 may be independent of the processing of thin film 260 loaded on loading fixture 262, e.g., the processing times may be the same or different, and if the same the processing sequences may be staggered from each other, etc. Upon completing the irradiation processing of thin film 230, the beam splitter element 70 can then direct the second laser beam pulses 56 to loading fixture 372 (having thin film 370 disposed thereon), as shown by the dotted lines in FIG. 14. The processed thin film 230 can then be removed from the loading fixture 232 and a new unprocessed thin film sample can be loaded and readied (on loading fixture 232) for processing.

Figure 15:
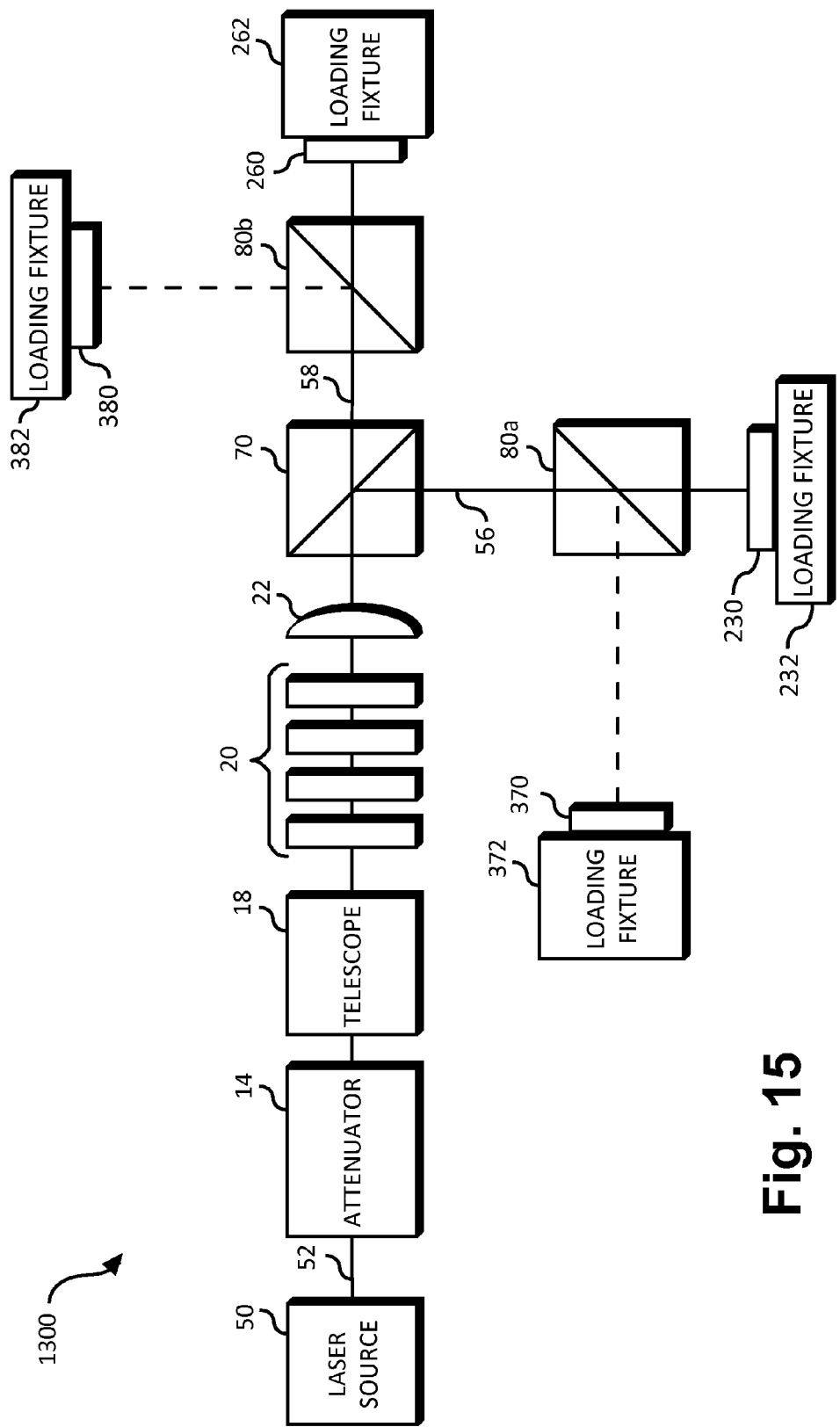
FIG. 15 depicts an exemplary system for processing a plurality of thin film sample in accordance with the present invention where thin film samples are loaded and unloaded onto third and fourth loading fixtures while thin film samples are being processed on other loading fixtures.

FIG. 15 depicts a further exemplary embodiment of a system constructed in accordance with the present invention. System 1300 of FIG. 15 includes four loading fixtures, fixtures 232, 262, 372, and 382. Preferably, at any given moment, two of the loading fixtures are being utilized to process thin film samples while other thin film samples are being unloaded and loaded onto the two remaining loading fixtures. System 1300 includes a laser source system 50, an attenuator 14, a telescope 18, a homogenizer 20, a condenser lens 22, a beam splitting element 70 and four loading fixtures, fixtures 232, 262, 372, and 382. Other optical elements (not shown), e.g., masks, projection lens, etc, as previously discussed, can be utilized downstream of the beam splitting element 70 between the loading fixtures 232, 262, 372, and 382 and the beam splitting element 70. Laser beam pulses 52 generated by the laser source system 50 enter the beam splitting element 70 after passing through the optical elements as shown. Beam splitting element 70 splits the laser beam pulses 52 into first laser beam pulses 58 and second laser beam pulses 56 as previously discussed. However, unlike system 1200, system 1300 also includes beam steering elements 80a and 80b. Beam steering elements 80a, 80b can act as switches for directing the second laser beam pulses 56 and first laser beam pulses 58, respectively. Such beam steering elements are readily known in the art. So, unlike the beam splitting element 70 of system 1200, which was capable of both splitting laser beam pulse 52 and directing the component laser beam pulses 56, 58 along a plurality of optical paths, system 1300 provides beam steering elements 80a and 80b that are separate from the beam splitting element 70.

The first laser beam pulses 58 are directed from the beam splitting element 70 to beam steering elements 80b. Beam steering elements 80b controls whether first laser beam pulses 58 are to be delivered to loading fixture 262 or, alternatively, to loading fixture 382. The second laser beam pulses 56 are directed from the beam splitting element 70 to beam steering elements 80a. Beam steering elements 80a controls whether second laser beam pulses 56 are to be delivered to loading fixture 232 or, alternatively, to loading fixture 372. Since the beam splitter element 70 of system 1300 only "produces" two component laser beam pulses 56, 58 and there are four loading fixtures (each of which may hold a thin film sample), at any given moment at least two of the loading fixtures 232, 262, 372, 382 are thus not receiving a component laser beam pulse 56, 58. Based upon the arrangement of system 1300, at any given moment, one of the loading fixtures 232 or 372 and one of the loading fixtures 262 or 382 are preferably receiving first laser beam pulses 58 and second laser beam pulses 56, respectively. Moreover, while one of the loading fixtures 232, 372 is receiving first laser beam pulses 58, thin film samples can be unloaded/loaded onto the other loading fixture. Similarly, while one of the loading fixtures 262, 382 is receiving second laser beam pulses 56, thin film samples can be unloaded/loaded on the other load fixture.

For example, as shown in FIG. 15, first laser beam pulses 58 are initially directed via beam steering element 80b to loading fixture 262 (having thin film 260 disposed thereon) and second laser beam pulses 56 are initially directed via beam steering element 80a to loading fixture 232 (having thin film 230 disposed thereon). While thin films 230, 260 of loading fixtures 232, 262, respectively, are being irradiated, thin film samples can be unloaded (if a processed thin film sample is present) and thin films 370, 380 can be loaded onto inactive loading fixtures 372, 382, respectively. The processing of thin films 230, 260 loaded on loading fixtures 232, 262 can be performed concurrently or, alternatively, the processing of thin film 230 loaded on loading fixture 232 may be independent of the processing of thin film 260 that is loaded on loading fixture 262, e.g., the processing times may be the same or different, and if the same the processing sequences may be staggered from each other, etc. Upon completing the irradiation processing of thin film 230 (loaded on loading fixture 232), the beam steering element 80a then directs the second laser beam pulses 56 to loading fixture 372, as shown by the dotted lines in FIG. 15, where thin film 370 has already been loaded. The processed thin film 230 can then be removed from loading fixture 232 and a new unprocessed thin film sample can be loaded on loading fixture 230 and readied for processing. Similarly, upon completing the irradiation processing of thin film 260 (loaded on leading fixture 262), the beam steering element 80b then directs the first laser beam pulses 58 to loading fixture 382, as shown by the dotted lines in FIG. 15, where thin film 380 has already been loaded. The processed thin film 260 can then be removed from loading fixture 262 and a new unprocessed thin film sample can be loaded on loading fixture 260 and readied for processing.

The methods of irradiating thin film samples loaded on a plurality of loading fixtures while unloading/loading thin film samples on the other loading fixtures which are not currently receiving irradiation can continue until the processing of all the thin film samples is completed. Thus the manufacturing throughput of systems 1200 and 1300 are further increased (e.g., over systems 1000 and 1100) because at least a portion of the sample handling times of loading thin film samples onto and from the loading fixtures are done in parallel with the irradiation processing of other thin film samples. Depending upon the time it takes to unload and load thin film samples onto a loading fixture and the amount of time that is required to process a thin film sample, in certain embodiments the handling processing times can be completely absorbed within the irradiation processing times so that the handling times do not contribute to the total manufacturing processing time. Accordingly, in certain embodiments, laser beam pulses that are generated by a laser source system that is constantly "on" can be fully utilized in the processing of thin film samples.

Further detail is provided in co-pending provisional patent application entitled "Laser-Irradiated Thin Films Having Variable Thickness" filed concurrently with the present disclosure, and in co-pending provisional patent application entitled "Systems And Methods For Inducing Crystallization of Thin Films Using Multiple Optical Paths" filed concurrently with the present disclosure, the contents of which are incorporated by reference.

The semiconductor device fabricated by the present invention includes not only an element such as a TFT or a MOS transistor, but also a liquid crystal display device (TFT-LCDs), an EL (Electro Luminescence) display device, an EC (Electro Chromic) display device, active-matrix organic light emitting diodes (OLEDs), static random access memory (SRAM), three-dimensional integrated circuits (3-D ICs), sensors, printers, and light valves, or the like, each including a semiconductor circuit (microprocessor, signal processing circuit, high frequency circuit, etc.) constituted by insulated gate transistors.

Although various embodiments that incorporate the teachings of the present invention have been shown and described in detail herein, those skilled in the art can readily devise many other varied embodiments that incorporate these teachings.

The invention claimed is:

1. A method of processing a plurality of thin films, comprising:
   loading a first thin film onto a first loading fixture;
   loading a second thin film onto a second loading fixture;
   generating laser beam pulses, each said generated laser beam pulse having a pulse duration;
   splitting each said generated laser beam pulse into at least a first laser beam pulse and a second laser beam pulse;
   directing at least one first laser beam pulse onto a first optical path and directing at least one second laser beam pulse onto a second optical path;
   irradiating said first thin film with said at least one first laser beam pulse to induce melting and subsequent crystallization of at least a portion of said first thin film; and
   irradiating said second thin film with said at least one second laser beam pulse to induce melting and subsequent crystallization of at least a portion of said second thin film, wherein at least a portion of said step of irradiating said first thin film and at least a portion of said step of irradiating said second thin film occur simultaneously.

2. The method of claim 1, further comprising:
   loading a third thin film onto a third loading fixture while said first thin film is being irradiated;

directing at least one first laser beam pulse onto a third optical path upon completing the processing of said first thin film;

irradiating said third thin film with said at least one first laser beam directed via said third optical path to induce melting and subsequent crystallization of at least a portion of said third thin film;

unloading said first thin film from said first loading fixture; and loading another thin film onto said first loading fixture, wherein said steps of unloading said first thin film from said first loading fixture and loading another thin film onto said first loading fixture substantially occur while said third thin film is being irradiated.

3. The method of claim 2, further comprising:

loading a fourth thin film onto a fourth loading fixture while said second thin film is being irradiated;

directing at least one second laser beam pulse onto a fourth optical path upon completing the processing of said second thin film irradiating said fourth thin film with said at least one second laser beam directed via said fourth optical path to induce melting and subsequent crystallization of at least a portion of said fourth thin film;

unloading said second thin film from said second loading fixture; and loading another thin film onto said second loading fixture, wherein said steps of unloading said second thin film from said second loading fixture and loading another thin film onto said second loading fixture substantially occur while said fourth thin film is being irradiated.

4. The method of claim 1, wherein said irradiating said first thin film comprises at least one of the following: an excimer laser anneal (ELA) process, a sequential lateral solidification (SLS) process and a uniform grain structure (UGS) crystallization process.

5. The method of claim 1, wherein said first and second thin films are comprised of a semiconductor material.

6. The method of claim 5, wherein said semiconductor material comprises silicon, germanium or silicon-germanium.

7. The method of claim 1, wherein said first and second thin films are comprised of a metallic material.

8. The method of claim 1, wherein generating each said laser beam pulse having said pulse duration comprises:

generating a first component laser beam pulse having a first pulse duration;

generating a second component laser beam pulse having a second pulse duration; and integrating said first component laser beam pulse with said second component laser beam pulse to form said laser beam pulse having said pulse duration.

9. The method of claim 8, wherein said first component laser beam pulse is integrated with said second component laser beam pulse with a time delay that exists between said first and second component laser beam pulses.

10. The method of claim 8, wherein at least a portion of said first component laser beam is constructively added to at least a portion of said second component laser beam pulse.

11. A method of processing a thin film, comprising:

loading a thin film onto a loading fixture;

generating laser beam pulses by generating initial laser beam pulses having an initial pulse duration, and modifying said initial laser beam pulses to generate laser beam pulses having a pulse duration longer than said initial pulse duration;

splitting said generated laser beam pulses into at least first laser beam pulses and second laser beam pulses;

irradiating a first region of said thin film with said first laser beam pulses to induce melting and subsequent crystallization of said first region of said thin film; and irradiating a second region of said thin film with said second laser beam pulses to induce melting and subsequent crystallization of said second region of said thin film, wherein at least portions of said steps of irradiating said first region and irradiating said second region occur simultaneously.

12. The method of claim 11, wherein modifying said initial laser beam pulses comprises extending said initial laser beam pulses.

13. The method of claim 11, wherein generating initial laser beam pulses comprises generating first and second component laser beam pulses having first and second pulse durations, and wherein modifying said initial laser beam pulses comprises combining said first and second component laser beam pulses.

14. A method of processing a thin film, comprising:

loading at least one thin film onto at least one loading fixture;

generating laser beam pulses by generating initial laser beam pulses having an initial pulse duration, and modifying said initial laser beam pulses to generate laser beam pulses having a pulse duration longer than said initial pulse duration;

splitting said generated laser beam pulses into at least first laser beam pulses and second laser beam pulses;

irradiating a first region of said at least one thin film with said first laser beam pulses to induce melting and subsequent crystallization of said first region of said at least one thin film; and irradiating a second region of said at least one thin film with said second laser beam pulses to induce melting and subsequent crystallization of said second region of said at least one thin film, wherein at least portions of said steps of irradiating said first region and irradiating said second region occur simultaneously.

15. The method of claim 14, wherein first and second regions are located on a single thin film.

16. The method of claim 14, wherein said first region is located on a first thin film and said second region is located on a second thin film.

17. The method of claim 14, wherein modifying said initial laser beam pulses comprises extending said initial laser beam pulses.

18. The method of claim 14, wherein generating initial laser beam pulses comprises generating first and second component laser beam pulses having first and second pulse durations, and wherein modifying said initial laser beam pulses comprises combining said first and second component laser beam pulses.

* * * * *